(12) United States Patent
Yamazaki et al.

(10) Patent No.: US 9,939,262 B2
(45) Date of Patent: Apr. 10, 2018

(54) LIGHT-EMITTING DEVICE AND CAMERA

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Yoshiharu Hirakata, Kanagawa (JP); Nobuharu Ohsawa, Kanagawa (JP); Hisao Ikeda, Kanagawa (JP); Daiki Nakamura, Kanagawa (JP); Akihiro Kaita, Kanagawa (JP); Masatoshi Kataniwa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 729 days.

(21) Appl. No.: 14/462,090

(22) Filed: Aug. 18, 2014

(65) Prior Publication Data
US 2015/0055118 A1 Feb. 26, 2015

(30) Foreign Application Priority Data
Aug. 20, 2013 (JP) .................................. 2013-170613

(51) Int. Cl.
*G01C 3/08* (2006.01)
*H05B 33/08* (2006.01)
(Continued)

(52) U.S. Cl.
CPC ............ *G01C 3/08* (2013.01); *H05B 33/0845* (2013.01); *B60Q 1/2603* (2013.01);
(Continued)

(58) Field of Classification Search
CPC ............ H05B 33/0818; H05B 33/0848; H05B 33/0815; H05B 33/0824; H05B 33/083;
(Continued)

(56) References Cited

U.S. PATENT DOCUMENTS 7,598,927 B2 10/2009 Yamazaki et al.
8,319,714 B2 11/2012 Kojima et al.
(Continued)

FOREIGN PATENT DOCUMENTS

CN 202634506 12/2012
JP 2004-109430 A 4/2004
(Continued)

*Primary Examiner* — Luke D Ratcliffe
(74) *Attorney, Agent, or Firm* — Fish & Richardson P.C.

(57) ABSTRACT

A light-emitting device that can switch between two modes: single light emission and intermittent light emission is provided. The light-emitting device includes a driver circuit that can supply a control pulse signal, a constant current power supply that is supplied with the control pulse signal and can supply a constant current pulse, and a light-emitting panel that is supplied with the constant current pulse. The driver circuit includes a start switch circuit that can supply a start signal, a pulse-interval modulation circuit that can supply a pulse-interval modulation signal, and a microcomputer that is supplied with the start signal and the pulse-interval modulation signal and can supply the control pulse signal.

21 Claims, 16 Drawing Sheets

(51) Int. Cl.
*H01L 51/52* (2006.01)
*B60Q 1/26* (2006.01)

(52) U.S. Cl.
CPC ...... *H01L 51/5203* (2013.01); *H01L 51/5212* (2013.01); *H01L 51/5275* (2013.01)

(58) Field of Classification Search
CPC .......... G01S 17/10; G01S 7/484; G01C 3/08; H02M 7/42; Y02B 20/347
See application file for complete search history.

(56) References Cited

U.S. PATENT DOCUMENTS

| | | | |
|---|---|---|---|
| 8,550,907 | B2 | 10/2013 | Yamazaki et al. |
| 8,634,021 | B2 | 1/2014 | Kawakami |
| 8,710,762 | B2 | 4/2014 | Takahashi et al. |
| 2002/0003961 | A1 | 1/2002 | Yamaguchi |
| 2008/0185971 | A1 | 8/2008 | Kinoshita |
| 2008/0246403 | A1* | 10/2008 | Sagawa ................ G09G 3/3233 315/35 |
| 2009/0096385 | A1 | 4/2009 | Yamauchi |
| 2010/0066257 | A1 | 3/2010 | Lin et al. |
| 2010/0320936 | A1* | 12/2010 | Yao .................... H05B 33/0827 315/297 |
| 2011/0019373 | A1* | 1/2011 | Ryhanen et al. ....... A61B 5/117 361/760 |
| 2011/0101880 | A1 | 5/2011 | Ribarich |
| 2012/0026348 | A1 | 2/2012 | Yun et al. |
| 2012/0205679 | A1 | 8/2012 | Hiroki et al. |
| 2013/0063676 | A1 | 3/2013 | Tsuchihashi et al. |
| 2014/0211192 | A1* | 7/2014 | Grootjans .......... H05B 33/0818 356/5.01 |
| 2014/0347555 | A1 | 11/2014 | Hirakata et al. |
| 2015/0003034 | A1 | 1/2015 | Nakamura et al. |
| 2016/0227087 | A1 | 8/2016 | Hirakata et al. |
| 2017/0013689 | A1 | 1/2017 | Nakamura et al. |

FOREIGN PATENT DOCUMENTS

| | | |
|---|---|---|
| JP | 2007-163876 A | 6/2007 |
| JP | 2009-130132 A | 6/2009 |
| JP | 2009-295769 A | 12/2009 |
| JP | 2010-004692 A | 1/2010 |
| JP | 2010-028366 A | 2/2010 |
| JP | 2012-129478 A | 7/2012 |

* cited by examiner

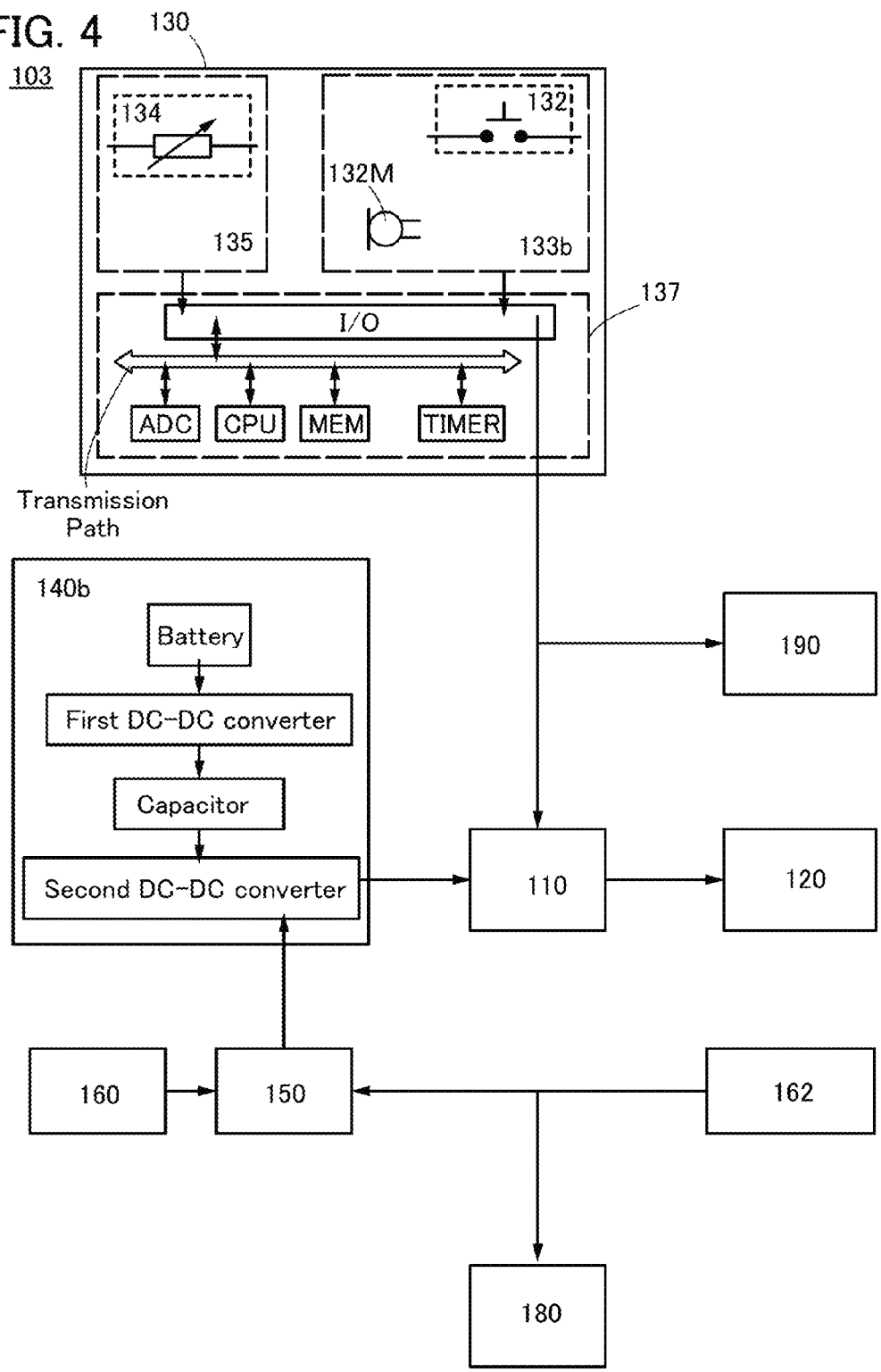

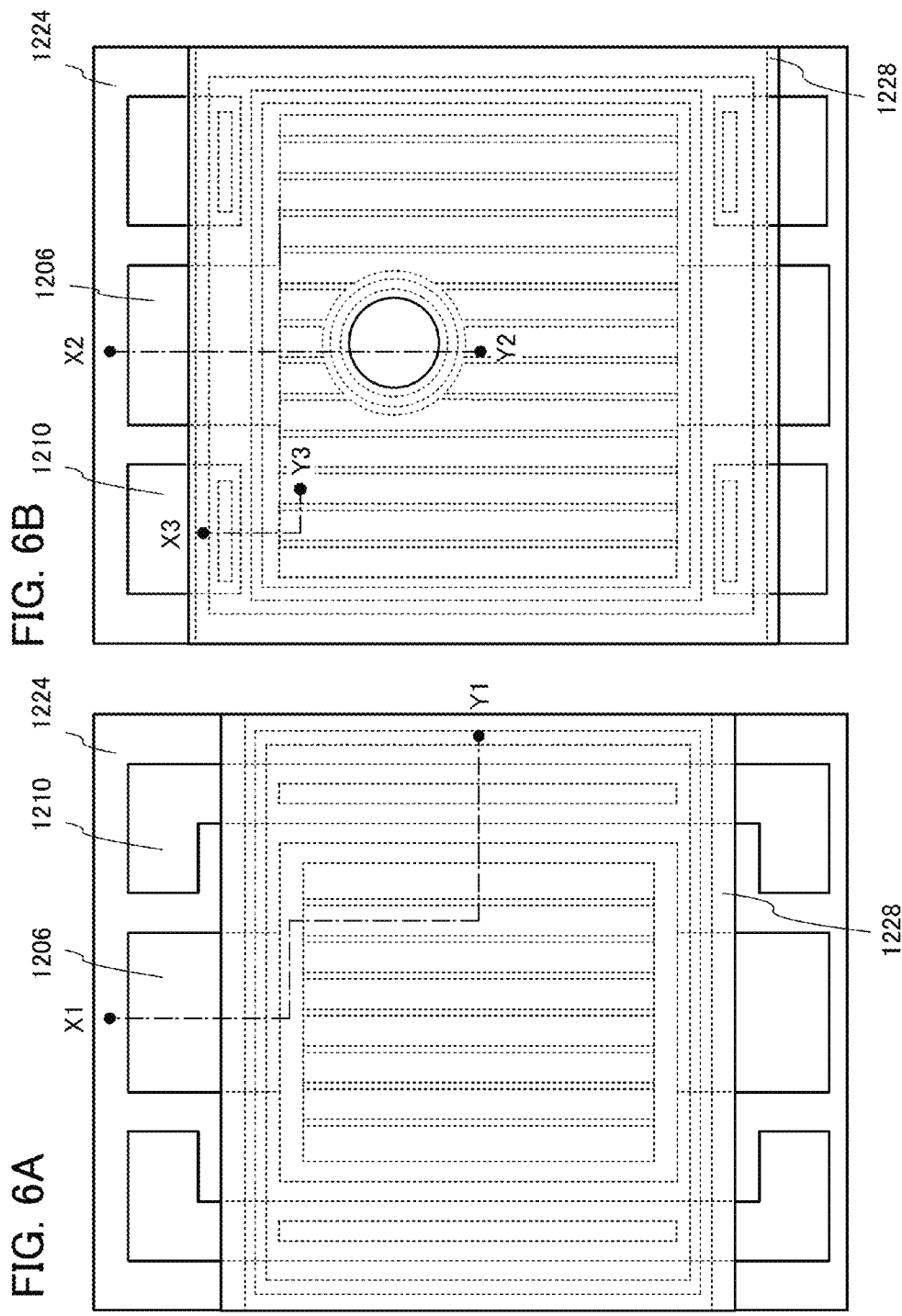

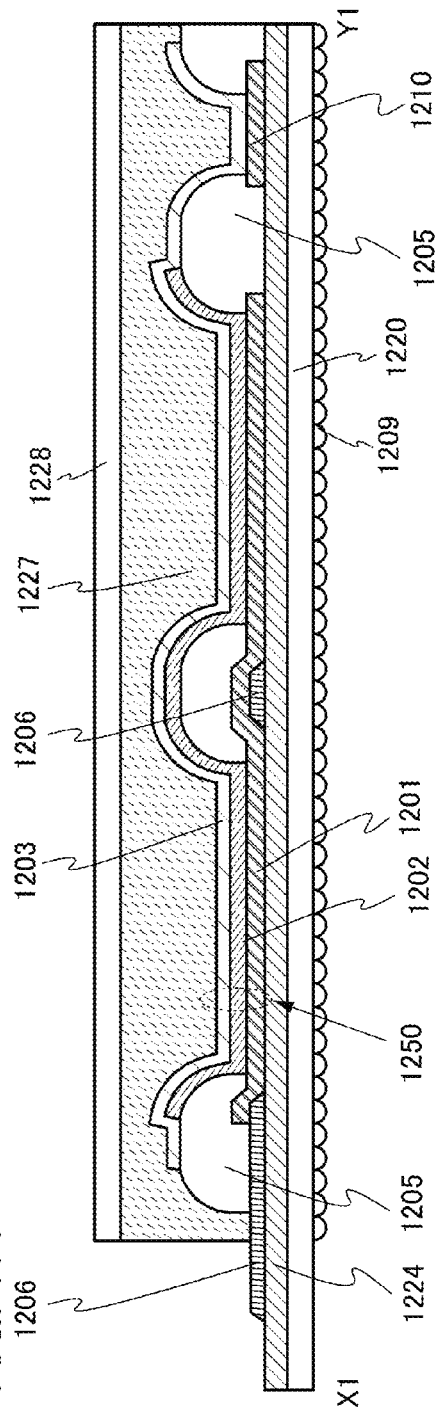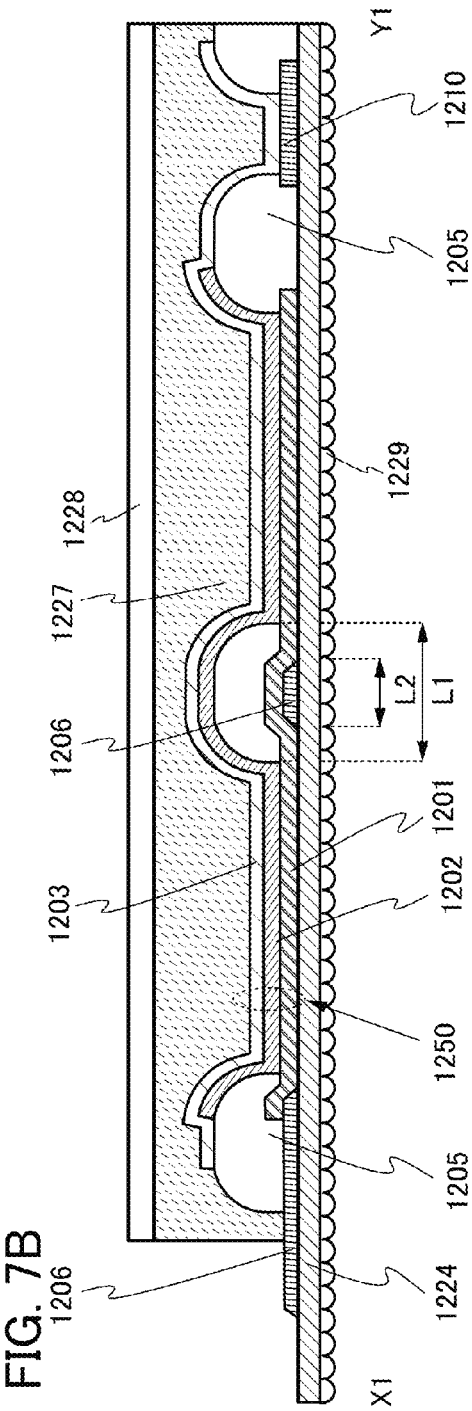

LIGHT-EMITTING DEVICE AND CAMERA

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a light-emitting device, an electronic appliance, a lighting device, a fabrication method thereof, or a driving method thereof. In particular, one embodiment of the present invention relates to a light-emitting device and an electronic appliance that utilize an organic electroluminescence (hereinafter also referred to as EL) phenomenon, and a driving method thereof.

2. Description of the Related Art

Research and development have been extensively conducted on light-emitting elements utilizing organic electroluminescence (EL) (also referred to as organic EL elements). In a basic structure of an organic EL element, a layer containing a light-emitting organic compound (also referred to as an EL layer) is provided between a pair of electrodes. By applying voltage to this element, light emission from the light-emitting organic compound can be obtained.

Since an organic EL element can be formed in a film form, an element with a large area can be easily formed. Thus, organic EL elements also have great potential as planar light sources that can be applied to lighting and the like.

For example, Patent Document 1 discloses a lighting device including an organic EL element.

Cameras are equipped with flashes for taking photographs in dark places. Cameras are required to be small and light enough to be carried easily.

REFERENCE

Patent Document 1: Japanese Published Patent Application No. 2009-130132

SUMMARY OF THE INVENTION

Portable lights that intermittently emit intense light are required for security reasons.

An object of one embodiment of the present invention is to provide a light-emitting device that can switch between two modes: single light emission and intermittent light emission.

Another object of one embodiment of the present invention is to provide a novel light-emitting device. Another object of one embodiment of the present invention is to provide a light-emitting device in which the amount of light can be adjusted. Another object of one embodiment of the present invention is to provide a highly reliable light-emitting device. Another object of one embodiment of the present invention is to provide a light-emitting device with low power consumption. Another object of one embodiment of the present invention is to provide a light-emitting device that is less likely to produce a shadow. Another object of one embodiment of the present invention is to reduce the size or weight of a light-emitting device.

Note that one embodiment of the present invention does not necessarily achieve all the objects describe above.

One embodiment of the present invention is a light-emitting device that includes a driver circuit that can supply a control pulse signal, a constant current power supply that is supplied with the control pulse signal and can supply a constant current pulse, and a light-emitting panel that is supplied with the constant current pulse. The driver circuit includes a start switch circuit that can supply a start signal, a pulse-interval modulation circuit that can supply a pulse-interval modulation signal, and a microcomputer that is supplied with the start signal and the pulse-interval modulation signal and can supply the control pulse signal.

Another embodiment of the present invention is a light-emitting device that includes a driver circuit that can supply a control pulse signal, a control device that can supply a control signal, a constant current power supply that is supplied with the control signal and the control pulse signal and can supply a constant current pulse, and a light-emitting panel that is supplied with the constant current pulse. The driver circuit includes a start switch circuit that can supply a start signal, a pulse-interval modulation circuit that can supply a pulse-interval modulation signal, and a microcomputer that is supplied with the start signal and the pulse-interval modulation signal and can supply the control pulse signal. The control signal is a signal for controlling the magnitude of the constant current pulse.

In the above-described light-emitting devices, the driver circuit preferably supplies the control pulse signal so that the constant current power supply supplies a constant current with a half width of 1 millisecond or more and 1000 milliseconds or less.

Another embodiment of the present invention is a light-emitting device that includes a driver circuit that can supply a control pulse signal, a constant current power supply that can supply a constant current, a switching circuit that is supplied with the constant current and the control pulse signal and can supply a constant current pulse, and a light-emitting panel that is supplied with the constant current pulse. The driver circuit includes a start switch circuit that can supply a start signal, a pulse-interval modulation circuit that can supply a pulse-interval modulation signal, and a microcomputer that is supplied with the start signal and the pulse-interval modulation signal and can supply the control pulse signal.

Another embodiment of the present invention is a light-emitting device that includes a driver circuit that can supply a control pulse signal, a control device that can supply a control signal, a constant current power supply that is supplied with the control signal and can supply a constant current, a switching circuit that is supplied with the constant current and the control pulse signal and can supply a constant current pulse, and a light-emitting panel that is supplied with the constant current pulse. The driver circuit includes a start switch circuit that can supply a start signal, a pulse-interval modulation circuit that can supply a pulse-interval modulation signal, and a microcomputer that is supplied with the start signal and the pulse-interval modulation signal and can supply the control pulse signal. The control signal is a signal for controlling the magnitude of the constant current pulse.

In the above-described light-emitting devices, the driver circuit preferably supplies the control pulse signal so that the switching circuit supplies a constant current with a half width of 1 millisecond or more and 1000 milliseconds or less.

In the above-described light-emitting devices, it is preferable that the light-emitting panel include a light-emitting element that preferably has a current density of 10 mA/cm$^2$ or more and 1000 mA/cm$^2$ or less.

The above-described light-emitting devices may further include an optical sensor that supplies a first detection signal corresponding to the detected amount of light. In that case, the control device includes an arithmetic unit and is supplied with the first detection signal. In the arithmetic unit, an arithmetic operation is performed using the first detection signal. The control device supplies the control signal so that the constant current power supply supplies a constant current corresponding to the result of the arithmetic operation.

The above-described light-emitting devices may further include a distance sensor that supplies a second detection signal corresponding to the detected distance. In that case, the control device includes an arithmetic unit and is supplied with the second detection signal. In the arithmetic unit, an arithmetic operation is performed using the second detection signal. The control device supplies the control signal so that the constant current power supply supplies a constant current corresponding to the result of the arithmetic operation.

The above-described light-emitting devices may include both the optical sensor and the distance sensor. In that case, the control device includes an arithmetic unit and is supplied with the first detection signal and the second detection signal. In the arithmetic unit, an arithmetic operation is performed using the first detection signal and the second detection signal. The control device supplies the control signal so that the constant current power supply supplies a constant current corresponding to the result of the arithmetic operation.

In the above-described light-emitting devices, the light-emitting panel may include a support substrate and a light-emitting element over the support substrate. The light-emitting element may include a first electrode, a second electrode, and an EL layer between the first and second electrodes. The first electrode is positioned on the side closer to the support substrate than the second electrode is, and the second electrode overlaps the first electrode. In that case, the support substrate may be a flexible substrate, and the light-emitting panel may have a curved surface.

In the above-described light-emitting device, the constant current power supply may further include an AC-DC converter that supplies a direct current and a DC-DC converter that is supplied with the direct current and can supply a constant current.

Note that in this specification, the AC-DC converter refers to a device that converts an alternating current into a direct current, and the DC-DC converter refers to a device that converts a voltage of a direct current from one level to another. The constant current power source may include a current sensor as well as the DC-DC converter.

The above-described light-emitting device may include a battery that supplies a first voltage, a first DC-DC converter that is supplied with the first voltage and supplies a second voltage higher than the first voltage, a capacitor that is supplied with the second voltage, and a second DC-DC converter that is supplied with a charge from the capacitor and can supply a constant current.

An electronic appliance, such as a camera or a digital still camera, including the above-described light-emitting device is also one embodiment of the present invention.

One embodiment of the present invention can provide a light-emitting device that can switch between two modes: single light emission and intermittent light emission.

BRIEF DESCRIPTION OF THE DRAWINGS

FIG. 4 illustrates a light-emitting device.
FIGS. 6A and 6B each illustrate a light-emitting panel.
FIGS. 7A and 7B each illustrate the light-emitting panel.

DETAILED DESCRIPTION OF THE INVENTION

Figure 1:
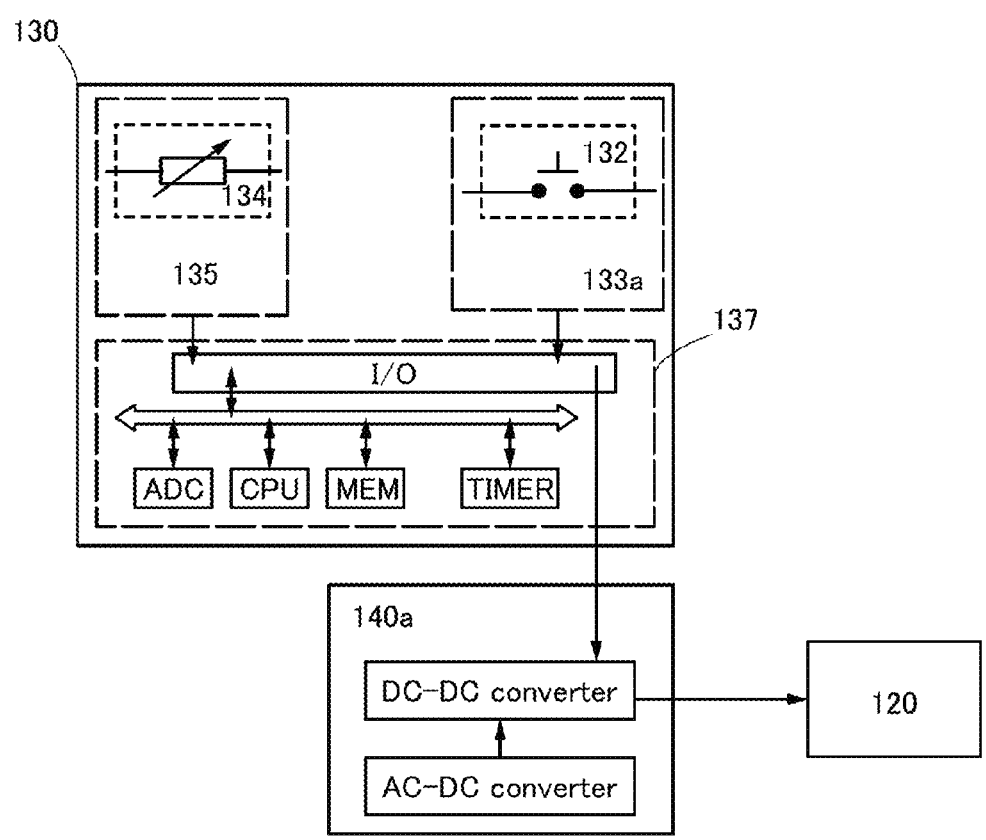
FIG. 1 illustrates a light-emitting device.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, structures of light-emitting devices of one embodiment of the present invention are described with reference to FIG. 1, FIGS. 2A to 2D, FIGS. 3A to 3C, and FIG. 4.

The light-emitting device of one embodiment of the present invention includes a driver circuit that can supply a control pulse signal, a constant current power supply that is supplied with the control pulse signal and can supply a constant current pulse, and a light-emitting panel that is supplied with the constant current pulse. Whether the light-emitting panel performs single light emission (also referred to as a pulse light emission, a flash, or the like) or intermittent light emission (also referred to as blink) can be controlled by the control pulse signal supplied by the driver circuit.

The driver circuit includes a start switch circuit that can supply a start signal, a pulse-interval modulation circuit that can supply a pulse-interval modulation signal, and a microcomputer that is supplied with the start signal and the pulse-interval modulation signal and can supply the control pulse signal. For example, the length of the start signal supplied to the microcomputer can determine whether the light-emitting panel performs single light emission or intermittent light emission. The pulse-interval modulation signal supplied to the microcomputer can control the interval between intermittent light emissions.

Single light emission of the light-emitting panel allows the light-emitting device of one embodiment of the present invention to be used as a camera flash. In addition, intermittent light emission of the light-emitting panel allows the light-emitting device of one embodiment of the present invention to be used as a security device.

Structure Example 1

A light-emitting device 100 illustrated in FIG. 1 includes a light-emitting panel 120, a driver circuit 130, and a constant current power supply 140a. FIG. 2C shows an example of a time-dependent change of current supplied from the constant current power supply 140a in the light-emitting device 100 illustrated in FIG. 1. For example, a current of 2 A can be supplied to the light-emitting panel 120 for 50 milliseconds.

The driver circuit 130 includes a start switch circuit 133a that can supply a start signal, a pulse-interval modulation circuit 135 that can supply a pulse-interval modulation signal, and a microcomputer 137 that is supplied with the start signal and the pulse-interval modulation signal and can supply a control pulse signal.

The constant current power supply 140a is supplied with the control pulse signal and can supply a constant current pulse. The light-emitting panel 120 is supplied with the constant current pulse.

<<Light-Emitting Panel>>

The light-emitting panel 120 includes a light-emitting element. Any of a point light source, a line light source, and a planar light source can be used for the light-emitting panel 120.

The light-emitting panel 120 includes, for example, a support substrate and a light-emitting element over the support substrate. The number of light-emitting elements may be one or more.

Examples of the light-emitting element are a light-emitting diode, a xenon lamp, and an organic EL element. Note that a structure of the light-emitting panel 120 is described in detail in Embodiment 2, and a structure of an organic EL element is described in detail in Embodiment 3.

The area of a light-emitting portion in the light-emitting panel 120 is greater than or equal to 0.5 cm$^2$ and less than or equal to 1 m$^2$, preferably greater than or equal to 5 cm$^2$ and less than or equal to 200 cm$^2$, further preferably greater than or equal to 15 cm$^2$ and less than or equal to 100 cm$^2$.

The current density of the light-emitting element that emits light in light-emitting panel 120 is, for example, greater than or equal to 10 mA/cm$^2$ and less than or equal to 2000 mA/cm$^2$.

The light-emitting panel 120 may include a plurality of light-emitting elements exhibiting different colors. When a color or color temperature of a camera flash can be changed, the reproducibility of a subject, an environment, an atmosphere, and the like when a photograph is taken can be enhanced. In addition, a light-emitting device may include a plurality of light-emitting panels exhibiting different colors.

A flexible light-emitting panel fabricated using a flexible material for a support substrate or the like can be placed along a housing having a curved surface. In that case, a light-emitting device can be positioned regardless of the design of a housing. For example, a flash can be positioned along a camera housing having a curved surface.

<<Constant Current Power Supply>>

The constant current power supply 140a includes an AC-DC converter that supplies a direct current and a DC-DC converter that is supplied with the direct current. The timing of supply of the constant current pulse from the DC-DC converter is controlled by a control pulse signal. Thus, the waveform of the constant current pulse can be shaped.

<<Driver Circuit>>

The driver circuit 130 supplies a control pulse signal with a predetermined width (half width). The predetermined width is, for example, greater than or equal to 1 millisecond and less than or equal to 1000 milliseconds, preferably greater than or equal to 10 milliseconds and less than or equal to 100 milliseconds.

The driver circuit 130 includes the start switch circuit 133a, the pulse-interval modulation circuit 135, and the microcomputer 137.

The start switch circuit 133a can supply a start signal. For example, the start switch circuit 133a is provided with a start switch 132 and supplies a high or low signal as the start signal while the start switch 132 is held down.

The pulse-interval modulation circuit 135 can supply a pulse-interval modulation signal. For example, a voltage changed by a variable resistor 134 can be used as the pulse-interval modulation signal.

The microcomputer 137 is supplied with the start signal and the pulse-interval modulation signal and can supply the control pulse signal.

The microcomputer 137 includes a central processing unit CPU, a timer unit TIMER, an analog-to-digital converter ADC, an input/output unit I/O, a memory unit MEM, and a transmission path for transmitting a data signal.

The input/output unit I/O is supplied with the start signal and the pulse-interval modulation signal and can supply the control pulse signal.

The analog-to-digital converter ADC converts an analog signal into a digital signal. For example, the analog-to-digital converter ADC converts the supplied pulse-interval modulation signal into a digital signal and supplies the digital signal.

The central processing unit CPU processes the supplied data in accordance with a program stored in the memory unit MEM and supplies the processed data.

The timer unit TIMER measures a predetermined period of time in accordance with an instruction and supplies a signal after the predetermined period of time elapses.

The memory unit MEM stores a program to be executed by the central processing unit CPU.

For example, when the start signal is supplied for a shorter period of time than a predetermined period of time, the microcomputer 137 supplies the control pulse signal once.

When the start signal is supplied for the predetermined period of time (or a longer period of time than the predetermined period of time), the microcomputer 137 supplies the control pulse signal plural times at intervals corresponding to the pulse-interval modulation signal.

Note that in the case where the microcomputer 137 supplies the control pulse signal plural times, the microcomputer 137 may supply the control pulse signal predetermined times, may keep supplying the control pulse signal intermittently while the start signal is supplied, or may keep supplying the control pulse signal intermittently until the start signal is supplied again.

A specific example of the case where the control pulse signal keeps being supplied intermittently until the start signal is supplied again is described below.

When the microcomputer 137 in a standby mode is supplied with a high or low start signal using the start switch 132, the microcomputer 137 supplies a rectangular wave with a predetermined width as the control pulse signal to the constant current power supply 140*a* and measures the time for which the start signal is supplied.

In the case where the start signal is supplied for a shorter period of time than a predetermined period of time, the microcomputer 137 supplies the control pulse signal once and then returns to the standby mode. Meanwhile, in the case where the start signal is supplied for the predetermined period of time (or a longer period of time than the predetermined period of time), the microcomputer 137 converts an analog pulse-interval modulation signal into a digital signal and keeps supplying the control pulse signal intermittently at predetermined pulse intervals determined by the converted digital signal until the start signal is supplied again.

In Structure Example 1, the control pulse signal is supplied to the constant current power supply 140*a* and used to control the constant current power supply 140*a*. However, the control pulse signal may be supplied to a switching circuit 110 as described later in Structure Example 2.

Structure Example 2

Figure 2A:
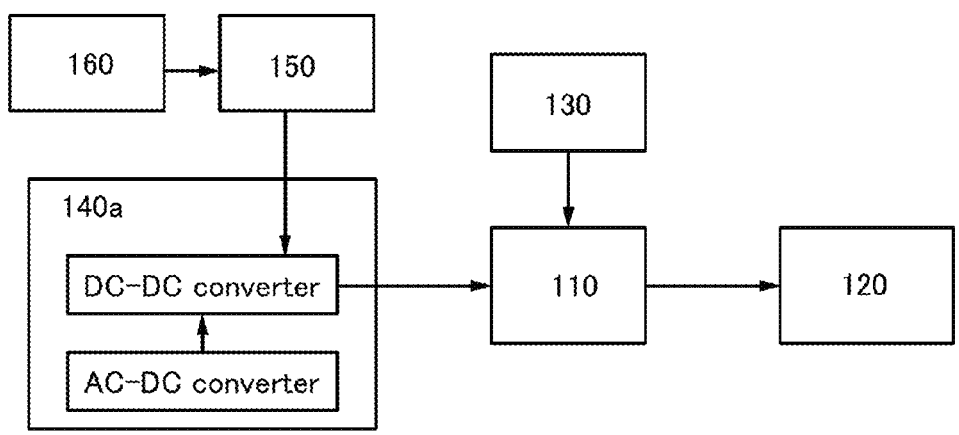
FIGS. 2A and 2D each illustrate a light-emitting device and FIGS. 2B and 2C each show an example of current used in the light-emitting device of FIG. 2A.

A light-emitting device 101 illustrated in FIG. 2A is different from the light-emitting device 100 illustrated in FIG. 1 in that the switching circuit 110, a control device 150, and a light sensor 160 are provided. Note that the other components are the same as those of the light-emitting device 100; thus, the description in Structure Example 1 can be referred to for the other components. The driver circuit 130 is not illustrated in detail in FIGS. 2A and 2D. The structure described with reference to FIG. 1 can be referred to for the driver circuit 130.

The switching circuit 110 is supplied with a constant current and a control pulse signal and can supply a constant current pulse. The driver circuit 130 can supply a control pulse signal. The constant current power supply 140*a* is supplied with a control signal and can supply the constant current.

In the light-emitting device of one embodiment of the present invention, the amount of light emitted from the light-emitting panel 120 can be adjusted by the control signal supplied by the control device 150. The amount of light may be adjusted manually by a user of the light-emitting device or automatically by the light-emitting device in accordance with the brightness around the light-emitting device detected by the optical sensor, the distance from the light-emitting device to an object (e.g., a photographic subject) detected by a distance sensor, or the like. In the control device capable of arithmetic processing, an arithmetic operation may be performed using the brightness, the distance, an image taken in advance, or the like, and the amount of light may be adjusted in accordance with the result of the arithmetic operation.

The control device 150 can supply a control signal. The control signal is a signal for controlling the magnitude of a constant current pulse. By changing the magnitude of the constant current pulse, the amount of light emitted from the light-emitting panel 120 can be adjusted. The control device 150 does not have to be provided in the case where the amount of light does not need to be adjusted.

In the case where the light-emitting panel 120 includes a plurality of light-emitting elements, the magnitude of constant current pulses supplied to the plurality of light-emitting elements may be controlled by one control signal or may be separately controlled by the respective control signals.

For example, in the case where the control device 150 is supplied with a signal corresponding to the amount of light that is selected by a user of the light-emitting device, the control device 150 may supply a control signal corresponding to the signal. In the case where the control device 150 is supplied with detection signals from a variety of sensors, the control device 150 may supply a control signal corresponding to the detection signals. In the case where the control device 150 includes an arithmetic unit, the control device 150 may perform an arithmetic operation using a signal supplied to the control device 150 and supply a control signal corresponding to the result of the arithmetic operation.

Structure Example 2 shows an example in which the amount of light is adjusted by the light sensor 160.

The optical sensor 160 can supply a detection signal to the control device 150 in accordance with the detected amount of light. The control device 150 includes an arithmetic unit. In the arithmetic unit, an arithmetic operation is performed using the detection signal. The control device 150 can supply a control signal to the constant current power supply 140*a* so that the constant current power supply 140*a* supplies a constant current corresponding to the result of the arithmetic operation. Since the control device 150 supplies a control signal to the constant current power supply 140*a*, the constant current power supply 140*a* can supply a constant current adjusted in accordance with the amount of light detected by the optical sensor 160 to the light-emitting panel 120.

Thus, the light-emitting device 101 can adjust the amount of light emitted from the light-emitting panel 120, in accordance with the amount of light detected by the optical sensor 160. For example, the optical sensor 160 detects the ambient brightness and the control device 150 performs an arithmetic operation, whereby the current supplied to the light-emitting panel 120 can be adjusted so that the light-emitting panel 120 emits the optimum amount of light.

For example, in the case where the light-emitting device 101 is used as a camera flash, the amount of light emitted from the light-emitting device 101 may be controlled to be decreased as the amount of light detected by the optical sensor 160 increases (i.e., as the brightness of an area around a photographic subject increases). This can prevent blown-out highlights or blocked up shadows of a photograph.

In the case where the light-emitting device 101 is used as a light of a bicycle or a vehicle, the light-emitting device 101 may be controlled so that the light-emitting device 101 emits light when the amount of light detected by the optical sensor 160 is smaller than or equal to a predetermined value. Furthermore, the amount of light emitted from the light-emitting device 101 may be controlled to be decreased as the amount of light detected by the optical sensor 160 decreases (i.e., as the surrounding area becomes darker so that light emitted from the light-emitting device 101 is perceived easily). This can prevent emission of excessive light, so that power saving and a long lifetime of the light-emitting device can be achieved.

The amount of light of the light-emitting panel 120 can be adjusted within the range where, for example, the current density of a light-emitting element is greater than or equal to 10 mA/cm$^2$ and less than or equal to 1000 mA/cm$^2$, preferably greater than or equal to 10 mA/cm$^2$ and less than or equal to 1500 mA/cm$^2$, further preferably greater than or equal to 10 mA/cm$^2$ and less than 1700 mA/cm$^2$, still further preferably greater than or equal to 1 mA/cm$^2$ and less than or equal to 2000 mA/cm$^2$.

<<Control Device>>

In the case where the control device 150 includes an arithmetic unit, an arithmetic operation can be performed using a signal supplied to the control device 150. Examples of the signal supplied to the control device 150 are detection signals supplied from a variety of sensors such as an optical sensor and a distance sensor, a signal obtained by amplifying the detection signal by an amplifier, and a signal obtained by converting the detection signal or the amplified signal from an analog signal to a digital signal by a converter. The control device 150 may include, for example, a processor such as a central processing unit (CPU) or a digital signal processor (DSP), or a memory such as a RAM or a ROM for storing an arithmetic operation program.

<<Optical Sensor>>

The optical sensor 160 includes a photoelectric conversion element such as a photodiode. The optical sensor 160 supplies a detection signal corresponding to the detected amount of light to the control device 150.

<<Switching Circuit>>

The switching circuit 110 supplies a constant current pulse to the light-emitting panel 120 while being supplied with a constant current and a control pulse signal.

The switching circuit 110 may include, for example, a power transistor. Specifically, the switching circuit 110 can be configured such that a control pulse signal is supplied to a gate of the power transistor, a constant current is supplied to a first electrode of the power transistor, and the light-emitting panel 120 is electrically connected to a second electrode of the power transistor.

Figure 2B:
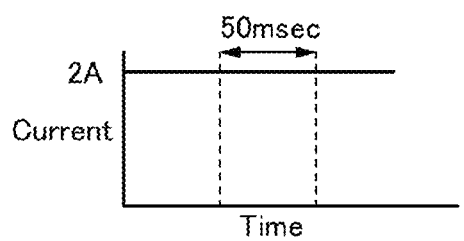
Figure 2C:
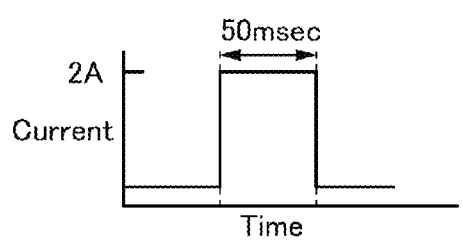

FIG. 2B shows an example of a constant current supplied by the DC-DC converter in the light-emitting device 101 illustrated in FIG. 2A. FIG. 2C shows an example of a time-dependent change of current supplied by the switching circuit 110. For example, a current of 2 A can be supplied to the light-emitting panel 120 for 50 milliseconds.

Figure 2D:
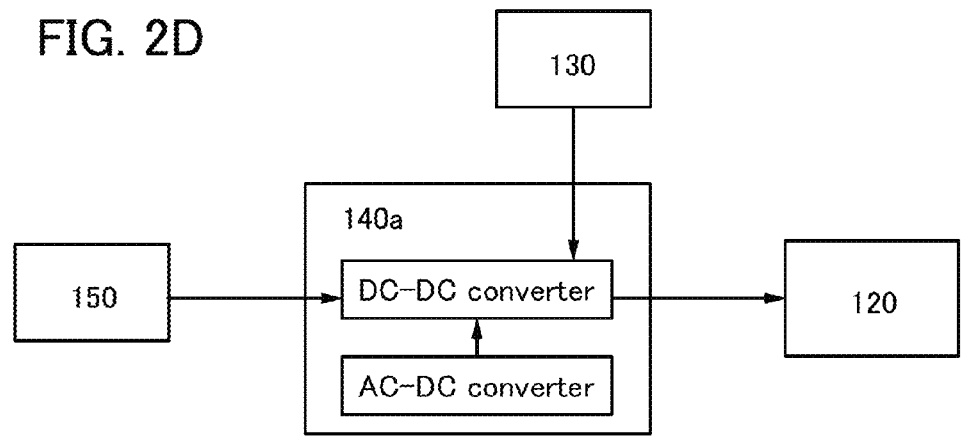

Note that the light-emitting device 100 in Structure Example 1 may include the control device 150 (FIG. 2D). In the light-emitting device illustrated in FIG. 2D, a control signal and a control pulse signal are supplied to the constant current power supply 140a.

Structure Example 3

Figure 3A:
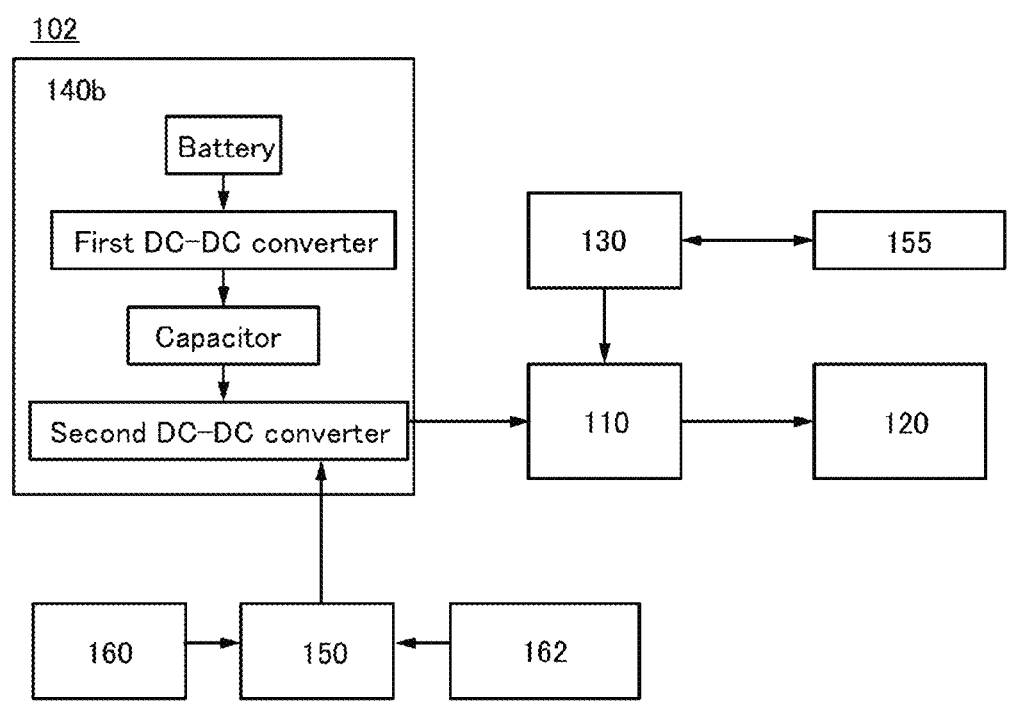
FIG. 3A illustrates a light-emitting device and FIGS. 3B and 3C each show an example of current used in the light-emitting device of FIG. 2A.

A light-emitting device 102 illustrated in FIG. 3A is different from the light-emitting device 101 illustrated in FIG. 2A in a structure of a constant current power supply and in that a distance sensor 162 and a counter circuit 155 are provided. Note that the other components are the same as those of the light-emitting device 101; thus, the description in Structure Example 2 can be referred to for the other components.

<<Distance Sensor>>

The distance sensor 162 supplies a detection signal corresponding to the measured distance to the control device 150. As the distance sensor 162, a variety of sensors such as an ultrasonic distance sensor or a laser distance sensor can be used.

The control device 150 performs an arithmetic operation using a detection signal supplied by the optical sensor and a detection signal supplied by the distance sensor. The control device 150 supplies a control signal to a constant current power supply 140b so that the constant current power supply 140b supplies a constant current corresponding to the result of the arithmetic operation. Since the control device 150 supplies the control signal to the constant current power supply 140b, the constant current power supply 140b can supply, to the switching circuit 110, a constant current adjusted in accordance with the amount of light detected by the optical sensor 160 or the distance measured by the distance sensor 162.

Thus, the light-emitting device 102 can adjust the amount of light emitted from the light-emitting panel 120, in accordance with the amount of light detected by the optical sensor 160 or the distance measured by the distance sensor 162. For example, in the case where the light-emitting device 102 is used as a camera flash, the optical sensor 160 detects the brightness of an area around a photographic subject, the distance sensor 162 measures the distance from the photographic subject to the camera, and the control device 150 performs an arithmetic operation, whereby the current supplied to the light-emitting panel 120 can be adjusted so that the light-emitting panel 120 emits an optimum amount of light. This can prevent blown-out highlights or blocked up shadows of a photograph. In addition, emission of excessive light can be prevented, so that power saving and a long lifetime of the light-emitting device can be achieved.

<<Modification Example of Constant Current Power Supply>>

The constant current power supply 140b includes a battery for supplying a first voltage, a first DC-DC converter that is supplied with the first voltage and supplies a second voltage higher than the first voltage, a capacitor that is supplied with the second voltage, and a second DC-DC converter that is supplied with a charge from the capacitor.

The first DC-DC converter steps up the voltage (the first voltage) of the battery to the second voltage and supplies the second voltage.

The capacitor is charged with the second voltage.

The second DC-DC converter is supplied with the charge stored in the capacitor and supplies a constant current.

This structure enables the second DC-DC converter to supply the constant current while the capacitor supplies the charge to the second DC-DC converter. Note that when the amount of charge stored in the capacitor is less than a predetermined amount, the second DC-DC converter cannot supply the constant current.

Figure 3B:
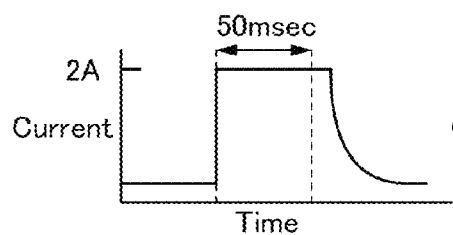

FIG. 3B shows an example of a time-dependent change of current supplied by the constant current power supply 140b.

Figure 3C:
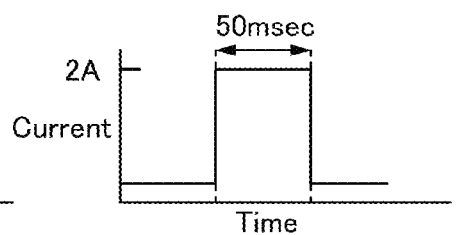

The constant current power supply 140b can supply the constant current for a period at least longer than the width of the control pulse signal (e.g., 50 milliseconds) supplied by the driver circuit 130. When the current flows through the switching circuit 110, the charge stored in the capacitor is consumed; eventually, it becomes impossible for the constant current power supply 140b to supply the constant current. As a result, a current that is not a rectangular wave flows to the light-emitting panel 120, whereby the light-emitting panel 120 emits light at a useless luminance lower than a predetermined luminance and consumes unnecessary power. The switching circuit 110 can prevent such unnecessary power consumption by stopping the supply of current after the supply of current for a predetermined period of time. FIG. 3C shows an example of a time-dependent change of current supplied by the switching circuit 110.

In this manner, the constant current power supply 140b can supply the constant current by using the battery. Thus, the light-emitting device 102 that can be easily carried around can be provided.

<<Counter Circuit>>

A counter circuit 155 counts the number of times the driver circuit 130 supplies the control pulse signal. Thus, the number of times the light-emitting panel 120 has emitted light can be known.

The luminance of the light-emitting panel 120 might be decreased depending on the number of times the light-emitting panel 120 has emitted light.

The decrease in the luminance of the light-emitting panel 120 can be compensated for by feeding back the number of times counted by the counter circuit 155 to the driver circuit 130 and increasing the width of the control pulse signal. Thus, the emission time of the light-emitting panel 120 can be prolonged and the decrease in the luminance of the light-emitting panel 120 can be compensated for.

Alternatively, the decrease in the luminance of the light-emitting panel 120 can be compensated for by feeding back the number of times counted by the counter circuit 155 to the constant current power supply 140b and increasing the amount of the constant current supplied by the constant current power supply 140b. Thus, the decrease in the luminance of the light-emitting panel 120 can be compensated for.

Structure Example 4

A light-emitting device 103 illustrated in FIG. 4 is different from the light-emitting device 102 illustrated in FIG. 3A in that an autofocus optical device 180 supplied with a detection signal and an imaging unit 190 supplied with a control pulse signal are provided and that the start switch circuit includes a microphone 132M. The light-emitting device 103 may include a counter circuit 155 similarly to the light-emitting device 102. Note that the other components are the same as those of the light-emitting device 102; thus, the description in Structure Example 3 can be referred to for the other components.

<<Autofocus Optical Device>>

The autofocus optical device (also referred to as autofocus device) 180 includes an optical lens, a transfer unit for the optical lens, and a control device for controlling the transfer amount of the transfer unit. The distance sensor 162 supplies a detection signal to the autofocus optical device 180. The optical lens is transferred to a predetermined position in accordance with the detection signal. Thus, it is possible to adjust the focal length of the optical lens to the distance measured by the distance sensor 162, so that the imaging unit 190 can take an image in focus.

<<Imaging Unit>>

The imaging unit 190 includes an imaging element and a driver circuit for the imaging element. The imaging unit 190 is supplied with a control pulse signal. The imaging unit 190 takes an image when supplied with the control pulse signal. A variety of imaging elements can be used for the imaging unit 190. For example, a CCD sensor or a CMOS sensor can be used for the imaging unit 190. Although a structure in which light is emitted and an image is taken every time the control pulse signal is supplied is illustrated here, the following structure may be employed: a circuit (e.g., a switch) is additionally provided, for example, between the driver circuit 130 and the imaging unit 190 or between the driver circuit 130 and the light-emitting panel 120, whereby the light-emitting device 103 can switch between operations of, for example, only emitting light, only taking an image, taking an image at least once in intermittent light emission, and emitting light at least once in intermittent imaging.

<<Modification Example of Start Switch Circuit>>

The start switch circuit 133b is provided with the microphone 132M that can supply an audio signal, and supplies a start signal. For example, the start switch circuit 133b supplies a high or low signal as the start signal while the microphone 132M is supplied with an audio signal representing a sound louder than a predetermined level.

In Structure Example 4, the driver circuit 130 supplies a control pulse signal when the start switch 132 is held down or the microphone 132M is supplied with a loud sound. Thus, the light-emitting panel 120 emits light and the imaging unit 190 takes an image. In that case, the autofocus optical device 180 adjusts the focal length of the optical lens in accordance with a detection signal supplied by the distance sensor 162, whereby a clear image can be taken using the imaging unit 190.

Figure 18:
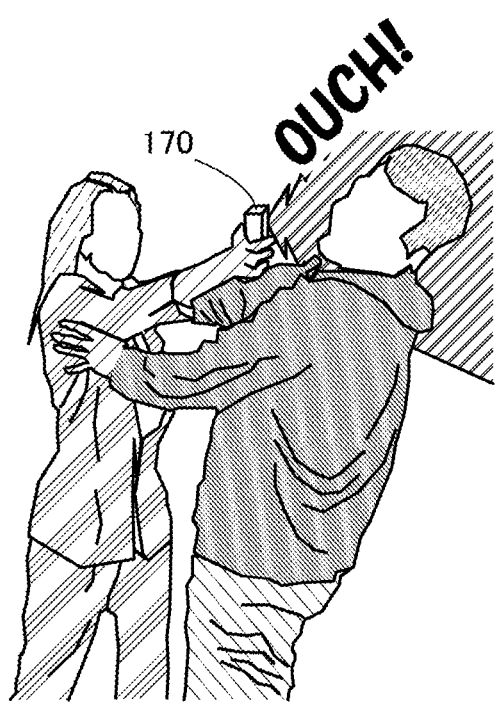
FIG. 18 illustrates a security device.

The light-emitting device 103 illustrated in FIG. 4 can be used for, for example, a security device 170 illustrated in FIG. 18. Specifically, with the light-emitting device 103, a user can not only emit light toward an assailant or the like to repulse the assailant or the like but also take an image of the assailant. This can prevent crimes. Even when a crime occurs, an image taken by the light-emitting device 103 makes it easy to identify a criminal. The light-emitting device 103 may be used for not only the security device 170 but also a camera such as a digital still camera, a mobile phone or portable information terminal with a photography function, and the like. The security device 170 may have a function as a camera, a mobile phone, or a portable information terminal.

When the start switch 132 is kept on for a predetermined period of time or a loud sound is kept being emitted, the driver circuit 130 can intermittently supply a control pulse signal predetermined number of times. Thus, the light-emitting panel 120 emits light and the imaging unit 190 takes an image. In that case, the autofocus optical device 180 adjusts the focal length of the optical lens in accordance with the detection signal supplied by the distance sensor 162, whereby a clear image can be taken using the imaging unit 190.

As described above, one embodiment of the present invention can provide a light-emitting device that can emit light once or intermittently emits light plural times. In addition, a light-emitting device in which the amount of emitted light can be adjusted by controlling a current value can be provided.

This embodiment can be combined with any of the other embodiments in this specification as appropriate.

Embodiment 2

In this embodiment, a structure of a light-emitting panel that can be used for the light-emitting device of one embodiment of the present invention is described with reference to FIGS. 5A and 5B, FIGS. 6A and 6B, and FIGS. 7A and 7B.

The light-emitting device of one embodiment of the present invention can be used as, for example, a camera flash. As a camera flash decreases in size, the shape of its light-emitting portion becomes more linear or point-like. Since light from a light source travels in a straight line, a smaller light source casts a sharper shadow of an object. Thus, when a photograph of a human face is taken in a dark place using a flash, for example, a shadow of a nose might be cast on a cheek.

In addition, when the intensity of a flash is excessively high, a portion having different brightness in reality might become uniformly white in a photograph (i.e., blown-out highlights) in some cases. In contrast, when the intensity of a flash is too low, a dark portion of a photograph might become uniformly black (i.e., blocked up shadows) in some cases. Thus, a flash is preferably capable of adjusting the amount of light depending on the surroundings and the condition of a photographic subject.

In view of the above, a light-emitting element that is a planar light source is used for a light-emitting panel in one embodiment of the present invention. For example, with the use of an organic EL element, a thin and large-area element can be formed easily. When a planar light source, a point light source, and a line light source emit the same amount of light, the planar light source can have a smaller amount of light per unit area or a shorter emission time than the point light source and the line light source. Thus, the amount of heat generation per unit area can be reduced. In addition, the planar light source releases heat easily because of its large light-emitting area. Thus, deterioration due to local heat generation of the light-emitting panel can be suppressed. A light-emitting device that has higher reliability and less deterioration of a light-emitting panel than a light-emitting device including a light-emitting diode using an inorganic material, or the like can be provided.

The light-emitting panel can be thinner and lighter in the case of using an organic EL element than in the case of using a conventional xenon lamp or the like. Heat generated by light emission is diffused over a large area in the light-emitting panel and is therefore released efficiently. Thus, heat accumulation in the light-emitting panel is suppressed; and, deterioration of the light-emitting panel is suppressed.

In the case where the light-emitting panel is a planar light source, a shadow is less likely to be cast on a photographic subject even when the light-emitting device of one embodiment of the present invention is used as a camera flash.

The light-emitting panel can be configured to emit white light by using a properly selected light-emitting organic compound. For example, a plurality of light-emitting organic compounds that emit light of complementary colors can be used. Alternatively, three kinds of light-emitting organic compounds that emit light of red, green, and blue can be used. Furthermore, a light-emitting device having excellent white balance can be obtained by using a plurality of organic compounds emitting light of different colors as appropriate.

By using a light-emitting organic compound, an emission spectrum can be broadened as compared to that of a light-emitting diode with an inorganic material. Light having a broad emission spectrum is close to natural light and suitable for photography.

An example of a structure of a light-emitting panel in which an organic EL element is used as a light-emitting element is described below.

<<Structure Example 1 of Light-Emitting Panel>>

Figure 5A:
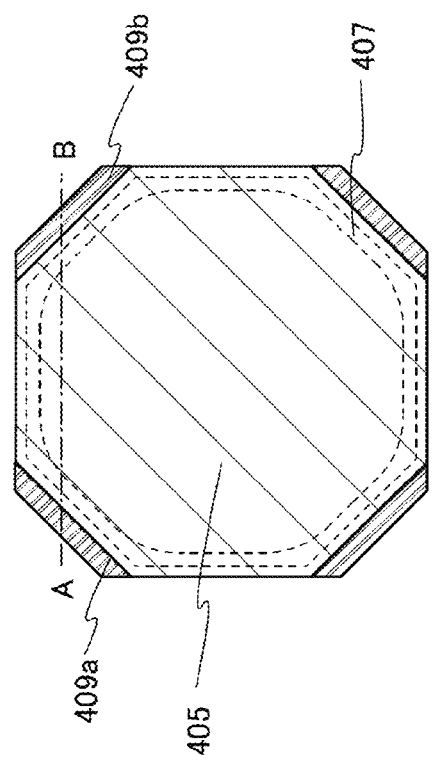
FIGS. 5A and 5B illustrate a light-emitting panel.
Figure 5B:
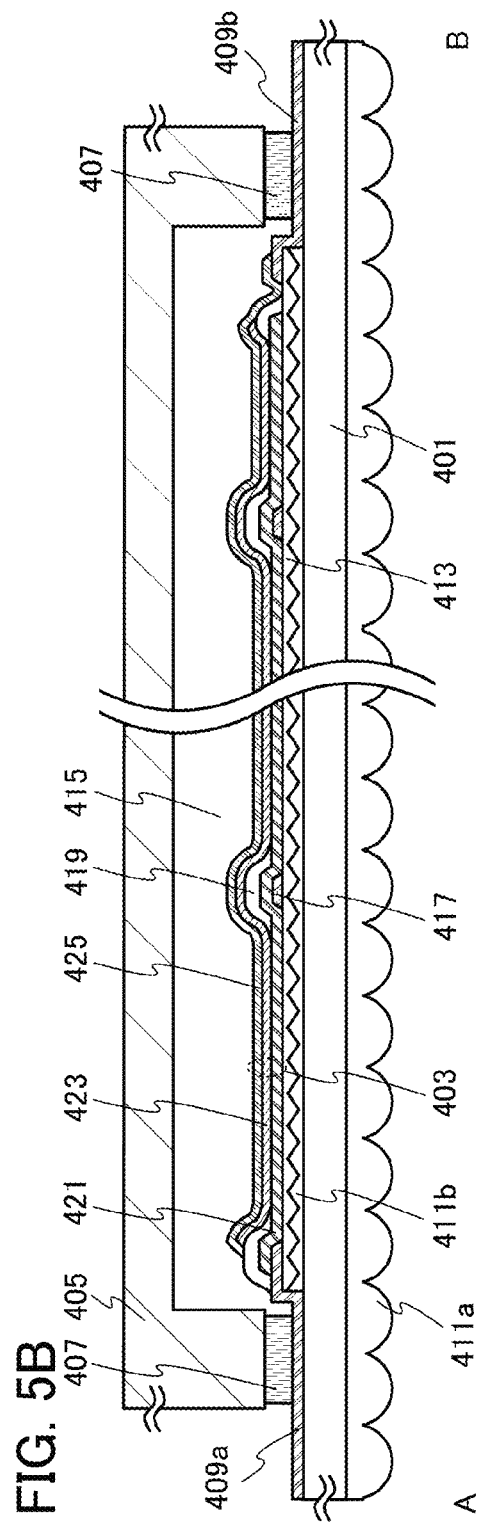

FIG. 5A is a plan view illustrating a light-emitting panel of one embodiment of the present invention, and FIG. 5B is a cross-sectional view taken along the dashed-dotted line A-B in FIG. 5A.

In the light-emitting panel illustrated in FIGS. 5A and 5B, the light-emitting element 403 is provided in a space 415 surrounded by the support substrate 401, a sealing substrate 405, and a sealant 407. The light-emitting element 403 is an organic EL element having a bottom-emission structure; specifically, the first electrode 421 that transmits visible light is provided over the support substrate 401, the EL layer 423 is provided over the first electrode 421, and the second electrode 425 that reflects visible light is provided over the EL layer 423.

The structure of the light-emitting element used in one embodiment of the present invention is not limited to the bottom-emission structure and may be, for example, a top-emission structure.

A first terminal 409a is electrically connected to an auxiliary wiring 417 and the first electrode 421. An insulating layer 419 is provided over the first electrode 421 in a region overlapping the auxiliary wiring 417. The first terminal 409a is electrically insulated from the second electrode 425 by the insulating layer 419. A second terminal 409b is electrically connected to the second electrode 425. Note that although the first electrode 421 is formed over the auxiliary wiring 417 in this embodiment, the auxiliary wiring 417 may be formed over the first electrode 421.

An outcoupling structure 411a is preferably provided at the interface between the support substrate 401 and the atmosphere. When provided at the interface between the support substrate 401 and the atmosphere, the outcoupling structure 411a can reduce light that cannot be extracted to the atmosphere because of total reflection, resulting in increased light extraction efficiency of the light-emitting panel.

In addition, an outcoupling structure 411b is preferably provided between the light-emitting element 403 and the support substrate 401. In the case where the outcoupling structure 411b has unevenness, a planarization layer 413 is preferably provided between the outcoupling structure 411b and the first electrode 421. This enables the first electrode 421 to be a flat film, and generation of leakage current in the EL layer 423 due to the unevenness of the first electrode 421 can be prevented. In addition, because of the outcoupling structure 411b at the interface between the planarization layer 413 and the support substrate 401, light that cannot be extracted to the atmosphere due to total reflection can be reduced, so that the light extraction efficiency of the light-emitting panel can be increased.

As a material of the outcoupling structure 411a and the outcoupling structure 411b, a resin can be used, for example. Alternatively, for the outcoupling structure 411a and the outcoupling structure 411b, a hemispherical lens, a micro lens array, a film provided with an uneven surface structure, a light diffusing film, or the like can be used. For example, the outcoupling structure 411a and the outcoupling structure 411b can be formed by attaching the lens or film to the support substrate 401 with an adhesive or the like having substantially the same refractive index as the support substrate 401 or the lens or film.

The surface of the planarization layer 413 that is in contact with the first electrode 421 is flatter than the surface of the planarization layer 413 that is in contact with the outcoupling structure 411b. As a material of the planarization layer 413, a material with a light-transmitting property and a high refractive index (e.g., glass, a resin, or a liquid substance such as a refractive index liquid) can be used.

Note that the light-emitting panel of one embodiment of the present invention is not necessarily provided with any light extraction structure. In that case, the second electrode that reflects visible light can be used as a mirror, which is preferable.

<<Structure Example 2 of Light-Emitting Panel>>

FIG. 6A is a plan view illustrating a light-emitting panel of one embodiment of the present invention, and FIGS. 7A and 7B are each a cross-sectional view taken along the dashed-dotted line X1-Y1 in FIG. 6A.

In the light-emitting panel illustrated in FIG. 7A, a light-emitting element 1250 is provided over a support substrate 1220 with an insulating film 1224 therebetween. The auxiliary wiring 1206 is provided over the insulating film 1224 and is electrically connected to the first electrode 1201. The auxiliary wiring 1206 is partly exposed and functions as a terminal. An end portion of the first electrode

1201 and an end portion of a conductive layer 1210 are covered with a partition wall 1205. In addition, the partition wall 1205 is provided to cover the auxiliary wiring 1206 with the first electrode 1201 therebetween. The light-emitting element 1250 is sealed with the support substrate 1220, a sealing substrate 1228, and a sealant 1227. An outcoupling structure 1209 is attached to the surface of the support substrate 1220. A flexible light-emitting panel can be obtained by using flexible substrates as the support substrate 1220 and the sealing substrate 1228.

The light-emitting element 1250 is an organic EL element having a bottom-emission structure; specifically, the first electrode 1201 transmitting visible light is provided over the support substrate 1220, an EL layer 1202 is provided over the first electrode 1201, and a second electrode 1203 reflecting visible light is provided over the EL layer 1202.

In the light-emitting panel illustrated in FIG. 7B, a support substrate 1229 having an outcoupling structure is provided instead of the support substrate 1220 and the outcoupling structure 1209 of the light-emitting panel illustrated in FIG. 7A. The support substrate 1229 has both a function as a support and a function of improving the light extraction efficiency of the light-emitting panel.

As methods for forming a light-emitting element over a flexible substrate in the case of fabricating a flexible light-emitting panel, there are methods such as a first method in which the light-emitting element is directly formed over a flexible substrate, and a second method in which the light-emitting element is formed over a highly heat-resistant substrate (hereinafter referred to as a formation substrate) that is different from a flexible substrate and the light-emitting element is then separated from the formation substrate and transferred to the flexible substrate.

When a substrate that is resistant to heat applied in the process of forming the light-emitting element, such as a glass substrate thin enough to have flexibility, is used, the first method is preferably employed, in which case the process can be simplified.

When the second method is employed, an insulating film with low water permeability or the like that is formed over a formation substrate at high temperature can be transferred to a flexible substrate. Thus, even when an organic resin with high water permeability and low heat resistance or the like is used as a material of the flexible substrate, a flexible light-emitting panel with high reliability can be fabricated.

<<Structure Example 3 of Light-Emitting Panel>>

Figure 8A:
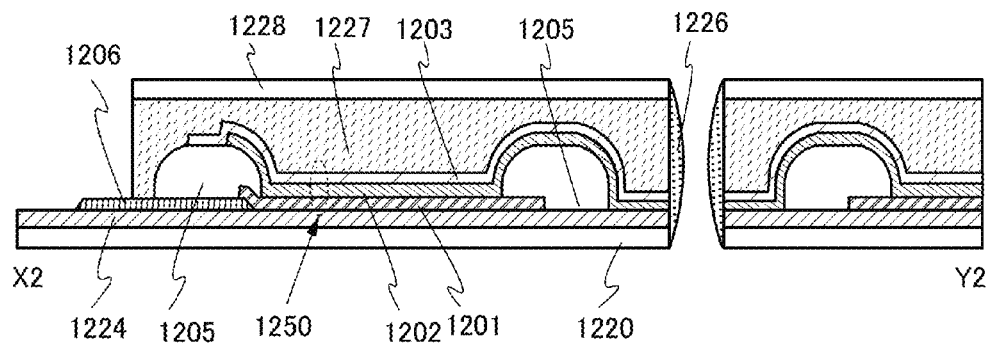
FIGS. 8A to 8C each illustrate the light-emitting panel.
Figure 8B:
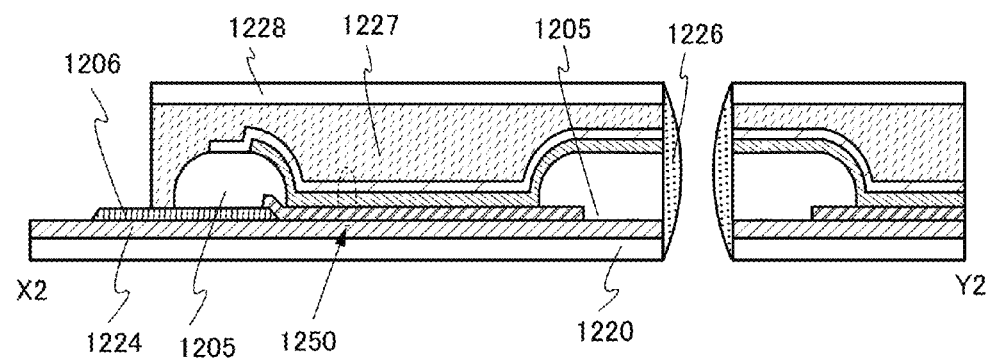
Figure 8C:
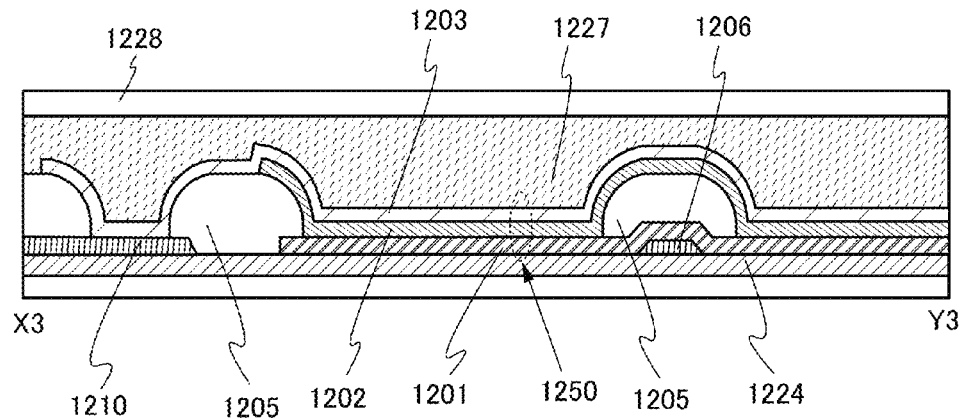

FIG. 6B is a plan view of a light-emitting panel of one embodiment of the present invention. FIGS. 8A and 8B are cross-sectional views taken along the dashed-dotted line X2-Y2 in FIG. 6B, which illustrate examples of cross-sectional structures. FIG. 8C is a cross-sectional view taken along the dashed-dotted line X3-Y3 in FIG. 6B.

The light-emitting panels illustrated in FIGS. 8A to 8C are different from the light-emitting panels described in Structure Example 2 in that openings are provided in parts of the light-emitting panels. Here, only different components are described in detail, and the description of the light-emitting panels in Structure Example 2 can be referred to for the common components.

As illustrated in FIGS. 8A and 8B, the light-emitting panel preferably includes a sealant 1226 in the opening to prevent an electrode or an EL layer from being exposed. Specifically, an opening is formed in the light-emitting panel, and then the sealant 1226 is formed to cover at least an exposed electrode and an exposed EL layer. The sealant 1226 may be the same material as or a different material from the sealant 1227.

FIG. 8A illustrates an example of an opening formed in a region where the partition wall 1205 is not provided. FIG. 8B illustrates an example of an opening formed in a region where the partition wall 1205 is provided.

A light-emitting panel is fabricated in the above-described manner, and a camera lens is provided to overlap the opening, whereby a light-emitting portion can be provided around the camera lens. The light-emitting portion can be used as a camera flash.

Note that an outcoupling structure may be provided on a surface of the substrate.

<<Material of Light-Emitting Panel>>

Examples of materials that can be used for the light-emitting panel of one embodiment of the present invention are described.

[Substrate]

The substrate on the side from which light from the light-emitting element is extracted is formed using a material that transmits the light. For example, a material such as glass, quartz, ceramics, sapphire, or an organic resin can be used.

The weight and thickness of the light-emitting panel can be decreased by using a thin substrate. Furthermore, a flexible light-emitting panel can be obtained by using a substrate that is thin enough to have flexibility. The flexible light-emitting panel can be stored folded when not in use. The flexible light-emitting panel can be used as a lighting device that emits a flash light over a large area, as an alternative to a board reflector in a photography studio. Alternatively, a foldable lighting device can be provided.

Examples of glass include alkali-free glass, barium borosilicate glass, and aluminoborosilicate glass.

Examples of a material that has flexibility and transmits visible light include flexible glass, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. Specifically, a material whose thermal expansion coefficient is low is preferably used and a polyamide imide resin, a polyimide resin, and polyethylene terephthalate (PET) can be favorably used, for example. A substrate in which a glass fiber is impregnated with an organic resin or a substrate whose thermal expansion coefficient is reduced by mixing an organic resin with an inorganic filler can also be used. A substrate using such a material is lightweight, and a light-emitting panel using this substrate can also be lightweight accordingly.

Since the substrate through which light emission is not extracted does not need to have a light-transmitting property, a metal substrate using a metal material or an alloy material or the like can be used in addition to the above-described substrates. A metal material and an alloy material, which have high thermal conductivity, are preferably used, in which case heat can be conducted to the whole substrate, so that a local temperature rise in the light-emitting panel can be prevented. To obtain flexibility and bendability, the thickness of a metal substrate is preferably greater than or equal to 10 μm and less than or equal to 200 μm, more preferably greater than or equal to 20 μm and less than or equal to 50 μm.

Although there is no particular limitation on a material of the metal substrate, it is preferable to use, for example, aluminum, copper, nickel, a metal alloy such as an aluminum alloy or stainless steel.

It is preferable to use a substrate subjected to insulation treatment in such a manner that a surface of the conductive substrate is oxidized or an insulating film is formed on the surface. An insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

The flexible substrate may have a stacked structure of a layer of any of the above-mentioned materials and a hard coat layer (e.g., a silicon nitride layer) that protects a surface of the light-emitting panel from damage or the like, a layer (e.g., an aramid resin layer) that can disperse pressure, or the like. Furthermore, to suppress a decrease in the lifetime of the light-emitting element due to moisture and the like, an insulating film with low water permeability may be provided. For example, a film containing nitrogen and silicon (e.g., a silicon nitride film, a silicon oxynitride film) or a film containing nitrogen and aluminum (e.g., an aluminum nitride film) may be provided.

The substrate may be formed by stacking a plurality of layers. When a glass layer is used, a barrier property against water and oxygen can be improved and thus a reliable light-emitting panel can be provided.

A substrate in which a glass layer, an adhesive layer, and an organic resin layer are stacked from the side closer to a light-emitting element can be used. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and a high flexibility. The thickness of the organic resin layer is greater than or equal to 10 μm and less than or equal to 200 μm, preferably greater than or equal to 20 μm and less than or equal to 50 μm. With such an organic resin layer provided on an outer side of the glass layer, breakage or a crack of the glass layer can be inhibited, resulting in increased mechanical strength. With the substrate that includes such a composite material of a glass material and an organic resin, a highly reliable and flexible light-emitting panel can be provided.

[Insulating Film]

An insulating film may be provided between the support substrate and the light-emitting element. As the insulating film, an inorganic insulating film such as a silicon oxide film, a silicon nitride film, a silicon oxynitride film, or a silicon nitride oxide film can be used. In order to suppress the entrance of moisture or the like into the light-emitting element, an insulating film with low water permeability such as a silicon oxide film, a silicon nitride film, or an aluminum oxide film is particularly preferable. For a similar purpose and with a similar material, an insulating film covering the light-emitting element may be provided.

[Partition Wall]

For the partition wall, an organic resin or an inorganic insulating material can be used. As the organic resin, for example, a polyimide resin, a polyamide resin, an acrylic resin, a siloxane resin, an epoxy resin, or a phenol resin can be used. As the inorganic insulating material, silicon oxide, silicon oxynitride, or the like can be used. In particular, a photosensitive resin is preferably used for easy formation of the partition wall.

There is no particular limitation on the method for forming the partition wall. A photolithography method, a sputtering method, an evaporation method, a droplet discharging method (e.g., an inkjet method), a printing method (e.g., a screen printing method or an offset printing method), or the like can be used.

[Auxiliary Wiring]

The auxiliary wiring is not necessarily provided; however, the auxiliary wiring is preferably provided because voltage drop due to the resistance of an electrode can be prevented.

For the auxiliary wiring, a single layer or a stacked layer using a material selected from copper (Cu), titanium (Ti), tantalum (Ta), tungsten (W), molybdenum (Mo), chromium (Cr), neodymium (Nd), scandium (Sc), or nickel (Ni) or an alloy material including any of these materials as its main component is used. Aluminum can also be used as a material of the auxiliary wiring. In the case where aluminum is in direct contact with a transparent conductive oxide material, aluminum might corrode. In order to prevent corrosion, it is preferable that the auxiliary wiring have a stacked-layer structure in which aluminum is used for a layer that is not in contact with ITO or the like. The thickness of the auxiliary wiring can be greater than or equal to 0.1 μm and less than or equal to 3 μm, preferably greater than or equal to 0.1 μm and less than or equal to 0.5 μm.

[Sealant]

A method for sealing the light-emitting panel is not limited, and either solid sealing or hollow sealing can be employed. For example, a glass material such as a glass frit, or a resin material such as a resin that is curable at room temperature (e.g., a two-component-mixture-type resin), a light curable resin, or a heat-curable resin can be used. The light-emitting panel may be filled with an inert gas such as nitrogen or argon, or resin such as a polyvinyl chloride (PVC) resin, an acrylic resin, a polyimide resin, an epoxy resin, a silicone resin, a polyvinyl butyral (PVB) resin, or an ethylene vinyl acetate (EVA) resin. A drying agent may be contained in the resin.

[Outcoupling Structure]

For the outcoupling structure, a hemispherical lens, a micro lens array, a film provided with an uneven surface structure, a light diffusing film, or the like can be used. For example, the outcoupling structure can be formed by attaching the lens or film to the substrate with an adhesive or the like that has substantially the same refractive index as the substrate or the lens or film.

The light-emitting panels described in this embodiment are planar light sources. Thus, by using each of the light-emitting panels in a light-emitting device, the light-emitting device is less likely to produce a shadow on a photographic subject even when used as a flash. A light-emitting panel of the light-emitting device is less likely to deteriorate even when it emits a large amount of light as compared to the case of using a light-emitting diode or the like using an inorganic material. Thus, the light-emitting device can have high reliability. The light-emitting device can be small and thin as compared to the case of using a xenon lamp or the like.

This embodiment can be combined with any of the other embodiments in this specification as appropriate.

Embodiment 3

In this embodiment, light-emitting elements that can be used in the light-emitting device of one embodiment of the present invention are described with reference to FIGS. 9A to 9D.

<<Structure Example of Light-Emitting Element>>

Figure 9A:
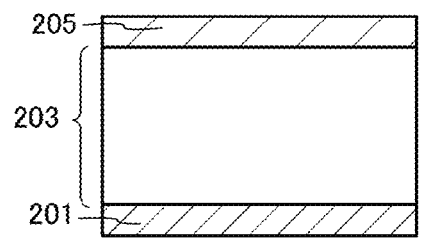
FIGS. 9A to 9D each illustrate a light-emitting element.

A light-emitting element illustrated in FIG. 9A includes an EL layer 203 between a first electrode 201 and a second electrode 205. In this embodiment, the first electrode 201 serves as the anode, and the second electrode 205 serves as the cathode.

When a voltage higher than the threshold voltage of the light-emitting element is applied between the first electrode 201 and the second electrode 205, holes are injected to the EL layer 203 from the first electrode 201 side and electrons are injected to the EL layer 203 from the second electrode 205 side. The injected electrons and holes are recombined in the EL layer 203 and a light-emitting material contained in the EL layer 203 emits light.

The EL layer 203 includes at least a light-emitting layer 303 containing a light-emitting substance.

In addition to the light-emitting layer, the EL layer 203 may further include one or more layers containing any of a substance with a high hole-injection property, a substance with a high hole-transport property, a substance with a high electron-transport property, a substance with a high electron-injection property, a substance with a bipolar property (a substance with a high electron-transport property and a high hole-transport property), and the like. For the EL layer 203, either a low molecular compound or a high molecular compound can be used, and an inorganic compound may also be used.

Figure 9B:
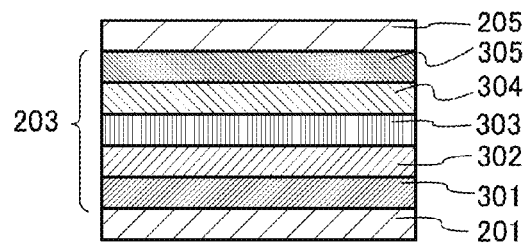

A light-emitting element illustrated in FIG. 9B includes the EL layer 203 between the first electrode 201 and the second electrode 205, and in the EL layer 203, a hole-injection layer 301, a hole-transport layer 302, the light-emitting layer 303, an electron-transport layer 304, and an electron-injection layer 305 are stacked in this order from the first electrode 201 side.

Figure 9C:
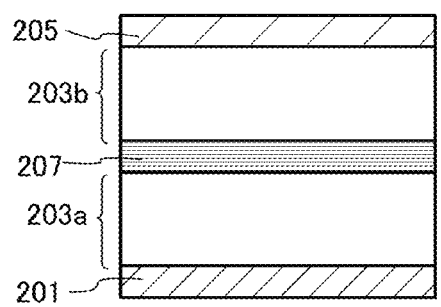
Figure 9D:
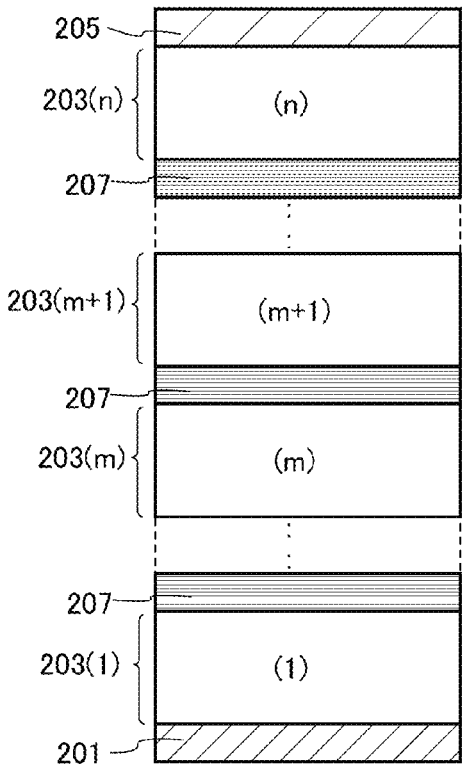

As in light-emitting elements illustrated in FIGS. 9C and 9D, a plurality of EL layers may be stacked between the first electrode 201 and the second electrode 205. In that case, an intermediate layer 207 is preferably provided between the stacked EL layers. The intermediate layer 207 includes at least a charge-generation region.

For example, the light-emitting element illustrated in FIG. 9C includes the intermediate layer 207 between a first EL layer 203a and a second EL layer 203b. The light-emitting element illustrated in FIG. 9D includes n EL layers (n is a natural number of 2 or more), and the intermediate layers 207 between the EL layers.

The behaviors of electrons and holes in the intermediate layer 207 provided between the EL layer 203($m$) and the EL layer 203($m$+1) are described below. When a voltage higher than the threshold voltage of the light-emitting element is applied between the first electrode 201 and the second electrode 205, holes and electrons are generated in the intermediate layer 207, and the holes move into the EL layer 203($m$+1) provided on the second electrode 205 side and the electrons move into the EL layer 203($m$) provided on the first electrode 201 side. The holes injected into the EL layer 203($m$+1) are recombined with the electrons injected from the second electrode 205 side, so that a light-emitting material contained in the EL layer 203($m$+1) emits light. The electrons injected into the EL layer 203($m$) are recombined with the holes injected from the first electrode 201 side, so that a light-emitting material contained in the EL layer 203($m$) emits light. Thus, the holes and electrons generated in the intermediate layer 207 cause light emission in the respective EL layers.

Note that the EL layers can be provided in contact with each other with no intermediate layer therebetween when these EL layers allow the same structure as the intermediate layer to be formed therebetween. For example, when the charge-generation region is formed over one surface of an EL layer, another EL layer can be provided in contact with the surface.

When the EL layers have different emission colors, a desired emission color can be obtained from the whole light-emitting element. For example, in the light-emitting element having two EL layers, when an emission color of the first EL layer and an emission color of the second EL layer are made to be complementary colors, a light-emitting element emitting white light as a whole light-emitting element can also be obtained. This can be applied to a light-emitting element including three or more EL layers.

<<Material of Light-Emitting Element>>

Examples of materials that can be used for each layer are given below. Note that each layer is not limited to a single layer and may be a stack of two or more layers.

<Anode>

The electrode serving as the anode (the first electrode 201) can be formed using one or more kinds of conductive metals, alloys, conductive compounds, and the like. In particular, it is preferable to use a material with a high work function (4.0 eV or more). Examples include indium tin oxide (ITO), indium tin oxide containing silicon or silicon oxide, indium zinc oxide, indium oxide containing tungsten oxide and zinc oxide, graphene, gold, platinum, nickel, tungsten, chromium, molybdenum, iron, cobalt, copper, palladium, titanium, and a nitride of a metal material (e.g., titanium nitride).

When the anode is in contact with the charge-generation region, any of a variety of conductive materials can be used regardless of their work functions; for example, aluminum, silver, an alloy containing aluminum, or the like can be used.

<Cathode>

The electrode serving as the cathode (the second electrode 205) can be formed using one or more kinds of conductive metals, alloys, conductive compounds, and the like. In particular, it is preferable to use a material with a low work function (3.8 eV or less). Examples include aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, and an alloy containing any of these rare earth metals.

Note that when the cathode is in contact with the charge-generation region, a variety of conductive materials can be used regardless of its work function. For example, ITO, indium tin oxide containing silicon or silicon oxide, or the like can be used.

The electrodes may be formed separately by a vacuum evaporation method or a sputtering method. Alternatively, when a silver paste or the like is used, a coating method or an inkjet method may be used.

<Hole-Injection Layer 301>

The hole-injection layer 301 contains a substance with a high hole-injection property.

Examples of the substance with a high hole-injection property include metal oxides such as molybdenum oxide, vanadium oxide, ruthenium oxide, tungsten oxide, and manganese oxide; and phthalocyanine-based compounds such as phthalocyanine (abbreviation: $H_2Pc$) and copper(II) phthalocyanine (abbreviation: CuPc).

Other examples of the substance with a high hole-injection property include high molecular compounds such as poly(N-vinylcarbazole) (abbreviation: PVK), poly(-vinyltriphenylamine) (abbreviation: PVTPA); and high molecular compounds to which acid is added such as poly(3,4-ethylenedioxythiophene)/poly(styrenesulfonic acid) (PEDOT/PSS).

The hole-injection layer 301 may serve as the charge-generation region. When the hole-injection layer 301 in contact with the anode serves as the charge-generation region, a variety of conductive materials can be used for the anode regardless of their work functions. Materials contained in the charge-generation region are described below.

<Hole-Transport Layer 302>

The hole-transport layer 302 contains a substance with a high hole-transport property.

The substance with a high hole-transport property is preferably a substance with a property of transporting more holes than electrons, and is especially preferably a substance with a hole mobility of $10^{-6}$ cm$^2$/Vs or more. A variety of compounds can be used. For example, an aromatic amine compound such as 4,4'-bis[N-(1-naphthyl)-N-phenylamino]biphenyl (abbreviation: NPB or α-NPD) or 4-phenyl-4'-(9-phenylfluoren-9-yl)triphenylamine (abbreviation: BPAFLP); a carbazole derivative such as 4,4'-di(N-carbazolyl)biphenyl (abbreviation: CBP), 9-[4-(10-phenyl-9-anthryl)phenyl]-9H-carbazole (abbreviation: CzPA), or 9-phenyl-3-[4-(10-phenyl-9-anthryl)phenyl]-9H-carbazole (abbreviation: PCzPA); an aromatic hydrocarbon compound such as 2-tert-butyl-9,10-di(2-naphthyl)anthracene (abbreviation: t-BuDNA), 9,10-di(2-naphthyl)anthracene (abbreviation: DNA), or 9,10-diphenylanthracene (abbreviation: DPAnth); a high molecular compound such as PVK or PVTPA.

<Light-Emitting Layer 303>

For the light-emitting layer 303, a fluorescent compound that exhibits fluorescence or a phosphorescent compound that exhibits phosphorescence can be used.

Examples of the fluorescent compound that can be used for the light-emitting layer 303 include N,N'-bis[4-(9H-carbazol-9-yl)phenyl]-N,N'-diphenylstilbene-4,4'-diamine (abbreviation: YGA2S), N-(9,10-diphenyl-2-anthryl)-N,9-diphenyl-9H-carbazol-3-amine (abbreviation: 2PCAPA), and rubrene.

Examples of the phosphorescent compound that can be used for the light-emitting layer 303 include organo metallic complexes such as bis[2-(4',6'-difluorophenyl)pyridinato-N,C$^{2'}$]iridium(III) picolinate (abbreviation: FIrpic), tris(2-phenylpyridinato-N,C$^{2'}$)iridium(III) (abbreviation: Ir(ppy)$_3$), and (acetylacetonato)bis(3,5-dimethyl-2-phenylpyrazinato)iridium(III) (abbreviation: Ir(mppr-Me)$_2$(acac)).

The light-emitting layer 303 may have a structure in which any of the above-described light-emitting organic compounds (a light-emitting substance or a guest material) is dispersed in another substance (a host material). As the host material, a variety of kinds of materials can be used, and it is preferable to use a substance that has a lowest unoccupied molecular orbital level (LUMO level) higher than that of the guest material and has a highest occupied molecular orbital level (HOMO level) lower than that of the guest material.

With the structure in which the guest material is dispersed in the host material, crystallization of the light-emitting layer 303 can be suppressed. In addition, concentration quenching due to high concentration of the guest material can be suppressed.

As the host material, the above-described substance with a high hole-transport property (e.g., an aromatic amine compound or a carbazole derivative) or a later-described substance with a high electron-transport property (e.g., a metal complex having a quinoline skeleton or a benzoquinoline skeleton or a metal complex having an oxazole-based or thiazole-based ligand) can be used. As the host material, specifically, a metal complex such as tris(8-quinolinolato)aluminum(III) (abbreviation: Alq) or bis(2-methyl-8-quinolinolato)(4-phenylphenolato)aluminum(III) (abbreviation: BAlq); a heterocyclic compound such as 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP); a condensed aromatic compound such as CzPA, DNA, t-BuDNA, or DPAnth; or an aromatic amine compound such as NPB can be used.

Alternatively, as the host material, a plurality of kinds of materials can be used. For example, in order to suppress crystallization, a substance such as rubrene that suppresses crystallization may be further added. In addition, NPB, Alq, or the like may be further added in order to transfer energy to the guest material more efficiently.

When a plurality of light-emitting layers are provided and emission colors of the layers are made different, light emission of a desired color can be obtained from the light-emitting element as a whole. For example, in a light-emitting element having two light-emitting layers, the emission colors of first and second light-emitting layers are complementary, so that the light-emitting element can emit white light as a whole. This can be applied to a light-emitting element including three or more light-emitting layers.

<Electron-Transport Layer 304>

The electron-transport layer 304 contains a substance with a high electron-transport property.

The substance with a high electron-transport property is preferably an organic compound having a property of transporting more electrons than holes, and is especially preferably a material with an electron mobility of $10^{-6}$ cm$^2$/Vs or more.

As the substance with a high electron-transport property, for example, a metal complex having a quinoline skeleton or a benzoquinoline skeleton, such as Alq or Balq, can be used. Alternatively, a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) or the like can be used. Alternatively, TAZ, BPhen, BCP, or the like can be used.

<Electron-Injection Layer 305>

The electron-injection layer 305 contains a substance with a high electron-injection property.

Examples of the substance with a high electron-injection property include alkali metals, alkaline earth metals, and compounds thereof, such as lithium, cesium, calcium, lithium fluoride, cesium fluoride, calcium fluoride, and lithium oxide. A rare earth metal compound such as erbium fluoride can also be used. Any of the above substances for the electron-transport layer 304 can also be used.

<Charge-Generation Region>

The charge-generation region may have either a structure in which an electron acceptor (acceptor) is added to an organic compound with a high hole-transport property or a structure in which an electron donor (donor) is added to an organic compound with a high electron-transport property. Alternatively, these structures may be stacked.

Examples of the organic compound with a high hole-transport property include the above materials that can be used for the hole-transport layer, and examples of the organic compound with a high electron-transport property include the above materials that can be used for the electron-transport layer.

As examples of the electron acceptor, 7,7,8,8-tetracyano-2,3,5,6-tetrafluoroquinodimethane (abbreviation: F4-TCNQ), chloranil, and the like can be given. In addition, transition metal oxides can be given. Moreover, oxides of metals belonging to Groups 4 to 8 of the periodic table can be given. Specifically, it is preferable to use vanadium oxide, niobium oxide, tantalum oxide, chromium oxide, molybdenum oxide, tungsten oxide, manganese oxide, and rhenium oxide because of their high electron accepting properties. Among these, molybdenum oxide is especially preferable because it is stable in the air, has a low hygroscopic property, and is easy to handle.

As the electron donor, it is possible to use an alkali metal, an alkaline earth metal, a rare earth metal, a metal belonging to Group 13 of the periodic table, or an oxide or a carbonate thereof. Specifically, lithium, cesium, magnesium, calcium, ytterbium, indium, lithium oxide, cesium carbonate, or the like is preferably used. Alternatively, an organic compound such as tetrathianaphthacene may be used as the electron donor.

The above-described layers included in the EL layer 203 and the intermediate layer 207 can be formed by any of the following methods: an evaporation method (including a vacuum evaporation method), a transfer method, a printing method, an inkjet method, a coating method, and the like.

This embodiment can be combined with any of the other embodiments in this specification as appropriate.

Embodiment 4

In this embodiment, electronic appliances including the light-emitting device of one embodiment of the present invention are described with reference to FIGS. 10A to 10C and FIGS. 11A to 11C.

The light-emitting device of one embodiment of the present invention can be used for a flash of a camera such as a digital still camera, a flash of a camera incorporated in a mobile phone (also called a cellular phone or mobile phone device) or a portable information terminal having a photography function, or the like. Alternatively, the light-emitting device of one embodiment of the present invention can be used for a light of a bicycle or a car, a beacon, illuminations for decorative purposes, or the like.

Figure 10A:
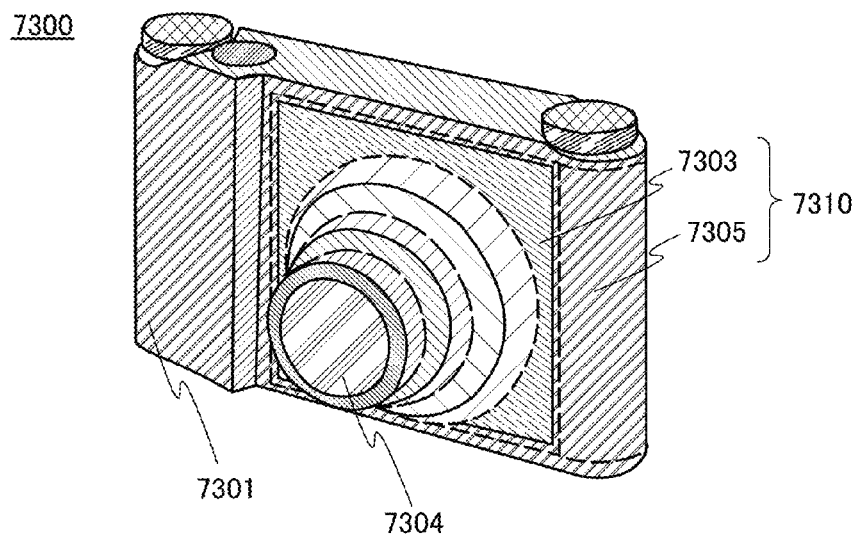
FIGS. 10A to 10C illustrate electronic appliances.

FIG. 10A illustrates an example of a digital still camera. A digital still camera 7300 includes a housing 7301, a lens 7304, a light-emitting device 7310, and the like. The light-emitting device of one embodiment of the present invention is used as the light-emitting device 7310. A light-emitting portion 7303 of the light-emitting device 7310 is located so as to surround the lens 7304. The light-emitting device of one embodiment of the present invention is flexible and can thus be curved. In the digital still camera 7300, a non-light-emitting portion 7305 of the light-emitting device 7310 is bent to fit the shape of the housing 7301, which enables the light-emitting portion 7303 to be located over a large area around the lens 7304. This can make a shadow of a nose less likely to be cast on a cheek when a photograph of a human face is taken in a dark place using a flash, for example. Note that a light-emitting element may be formed in the non-light-emitting portion 7305 through the same process and may be used as an indicator of operating conditions.

Figure 10B:
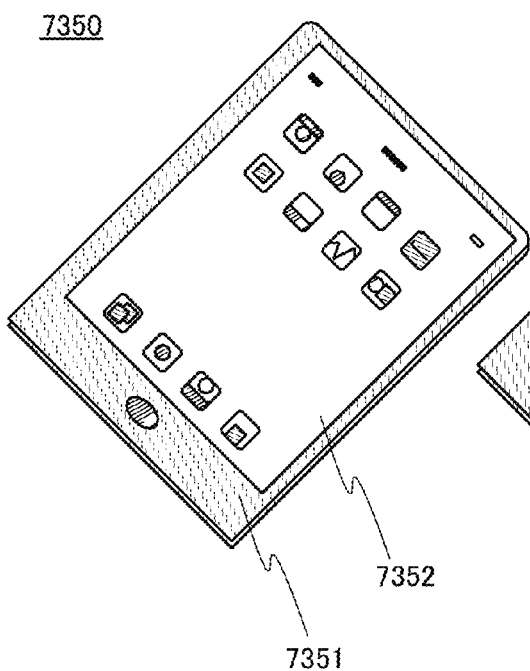
Figure 10C:
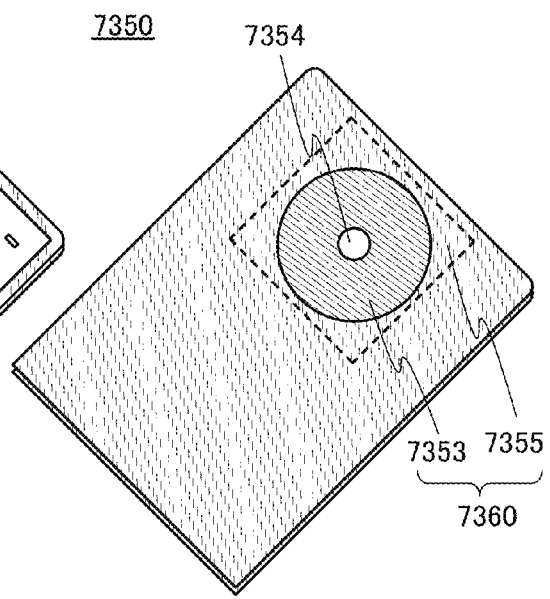

FIGS. 10B and 10C illustrate an example of a mobile phone. One side (also referred to as a front side) of a mobile phone 7350 is illustrated in FIG. 10B, and a side opposite the one side (also referred to as a back side) is illustrated in FIG. 10C.

The mobile phone 7350 includes a housing 7351, a display portion 7352, a lens 7354, a light-emitting device 7360, and the like. The light-emitting device of one embodiment of the present invention is used as the light-emitting device 7360. The light-emitting device 7360 includes a light-emitting portion 7353 and a non-light-emitting portion 7355, and the light-emitting portion 7353 is located so as to surround the lens 7354. The light-emitting portion 7353 may be used as a mirror when not emitting light.

Figure 11A:
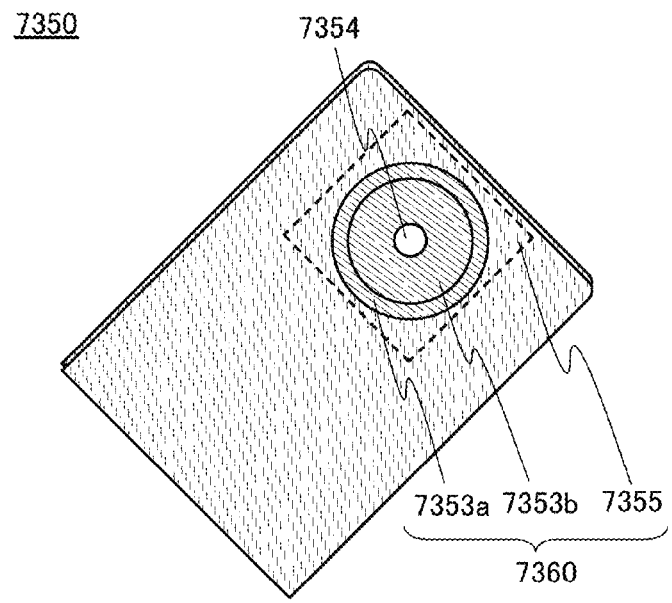
FIGS. 11A to 11C illustrate electronic appliances.

FIG. 11A illustrates a modification example of the light-emitting device 7360 of the mobile phone 7350. The light-emitting device 7360 illustrated in FIG. 11A includes two light-emitting panels 7353a and 7353b.

Figure 12:
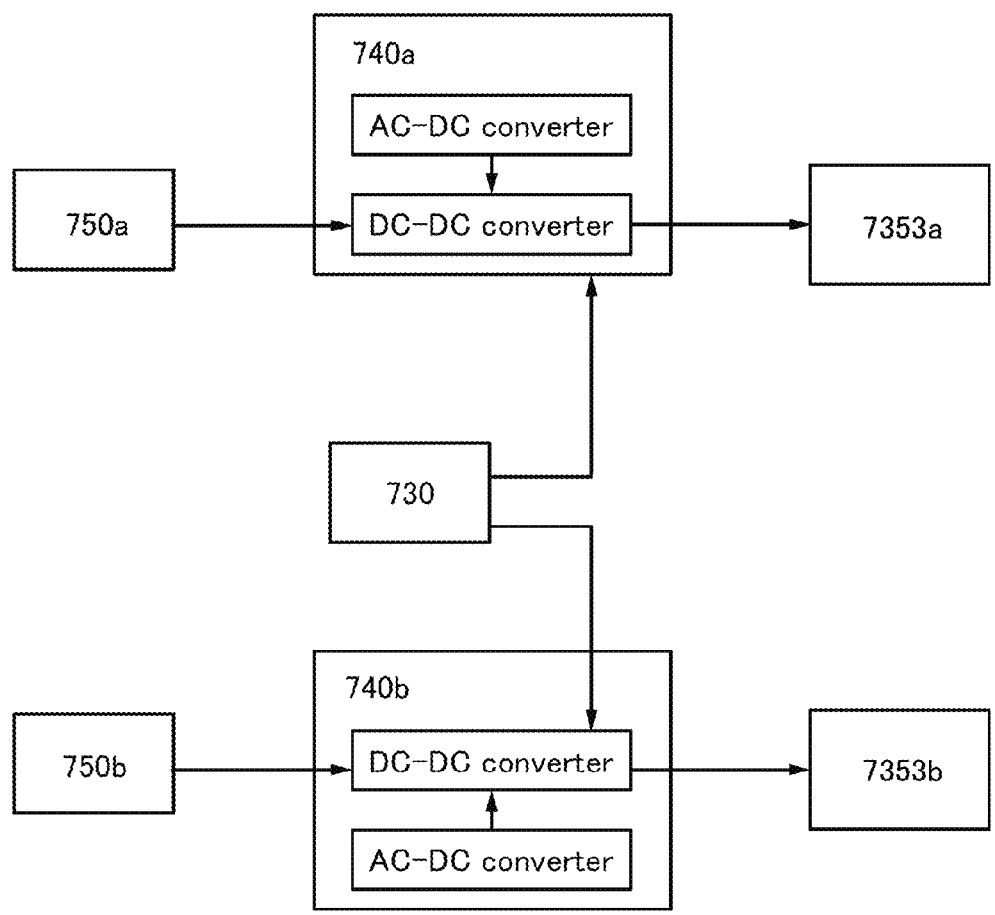
FIG. 12 illustrates a light-emitting device.

FIG. 12 is a block diagram of the light-emitting device 7360 illustrated in FIG. 11A. The light-emitting device 7360 includes the two light-emitting panels 7353a and 7353b, a driver circuit 730, two constant current supplies 740a and 740b, and two control devices 750a and 750b.

The two control devices 750a and 750b are supplied with a signal corresponding to a condition selected by a user of the mobile phone 7350 or detection signals from a variety of sensors. Each of the control devices 750a and 750b supplies a control signal corresponding to a supplied signal.

The constant current power supply 740a supplies, to the light-emitting panel 7353a, a constant current pulse corresponding to a control signal supplied by the control device 750a. The constant current power supply 740b supplies, to the light-emitting panel 7353b, a constant current pulse corresponding to a control signal supplied by the control device 750b. Thus, the amount of light of the light-emitting panels 7353a and 7353b is separately adjusted. As a result, the amount of light emitted from the light-emitting device can be adjusted in a wider range, which is preferable.

The light-emitting panels 7353a and 7353b may emit light with different colors or different color temperatures. For example, in the case where the two light-emitting panels have different color temperatures, the light-emitting device can emit light with an appropriate color temperature by separately adjusting the amount of light of the light-emitting panels.

A structure of the driver circuit 730 can be similar to the structure of the driver circuit 130 that is described in Embodiment 1. The light-emitting panels 7353a and 7353b are separately supplied with a control pulse signal by the driver circuit 730. In other words, the driver circuit 730 may supply the same control pulse signal or different control pulse signals to the light-emitting panels 7353a and 7353b.

Note that the light-emitting device 7360 may include two or more driver circuits and may include three or more light-emitting panels. The light-emitting device 7360 may include a combination of a light-emitting panel in which the amount of light cannot be adjusted and the light-emitting panel of one embodiment of the present invention in which the amount of light can be adjusted in combination.

In the light-emitting device 7360 having the structure illustrated in FIG. 12, the light-emitting panels 7353a and 7353b can emit light independently of each other. For example, when one light-emitting panel emits a sufficient amount of light, only one light-emitting panel may be made to emit light, and only when a larger amount of light is needed, both light-emitting panels may be made to emit light. This can reduce the power consumption of the light-emitting device and suppress deterioration of the light-emitting panels.

Figure 11B:
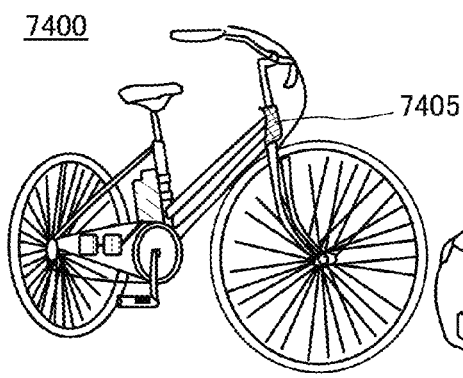

FIG. 11B illustrates an example of a bicycle. A bicycle 7400 includes a light 7405. The light 7405 includes the light-emitting device of one embodiment of the present invention.

Figure 11C:
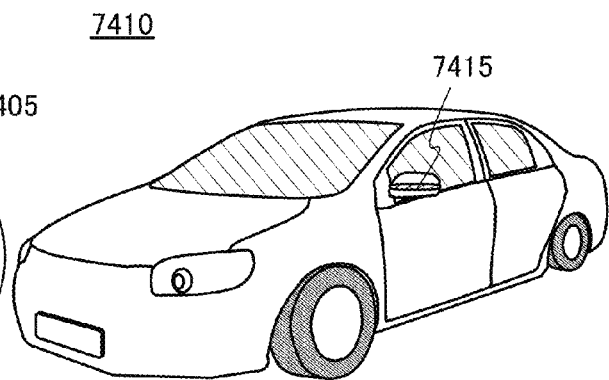

FIG. 11C illustrates an example of a car. A car 7410 includes a light 7415. The light-emitting device of one embodiment of the present invention is used for the light 7415.

In the case where the light-emitting device of one embodiment of the present invention is used for a light of a bicycle or a vehicle, after detection of the ambient brightness by an optical sensor, the following controls can be performed, for example: when the ambient brightness is sufficiently high, the light does not emit light; when the ambient brightness is sufficiently low, the light blinks; and when the ambient brightness is not sufficiently high but light is detected, the light blinks and the amount of light emitted from the light is increased. Thus, the light-emitting device of one embodiment of the present invention can emit an optimum amount of light, and a light with low power consumption can be achieved.

This embodiment can be combined with any of the other embodiments in this specification as appropriate.

Example 1

In this example, a light-emitting panel of one embodiment of the present invention is described.

FIG. 6A is a plan view of a light-emitting panel fabricated in this example, and FIG. 7B is a cross-sectional view taken along the dashed-dotted line X1-Y1 in FIG. 6A. Note that some components of the light-emitting panel are omitted in FIG. 6A.

In the light-emitting panel of this example, as illustrated in FIG. 7B, the light-emitting element 1250 is provided over the support substrate 1229 having an outcoupling structure with the insulating film 1224 therebetween. The auxiliary wiring 1206 is provided over the insulating film 1224 and is electrically connected to the first electrode 1201. The auxiliary wiring 1206 is partly exposed and functions as a terminal. An end portion of the first electrode 1201 and an end portion of a conductive layer 1210 are covered with a partition wall 1205. In addition, the partition wall 1205 is provided to cover the auxiliary wiring 1206 with the first electrode 1201 therebetween. The light-emitting element 1250 is sealed with the support substrate 1229, the sealing substrate 1228, and the sealant 1227.

In the light-emitting panel of this example, a diffusion film of a polyester-based resin was used as the support substrate 1229, and a substrate including a thin glass layer and a polyethylene terephthalate (PET) layer was used as the sealing substrate 1228. These substrates are flexible, and the light-emitting panel of this example is a flexible light-emitting panel. The area of a light-emitting region of the light-emitting panel of this example is 56 mm×42 mm.

The light-emitting element 1250 is an organic EL element having a bottom-emission structure; specifically, the first electrode 1201 that transmits visible light is provided over the support substrate 1229, the EL layer 1202 is provided over the first electrode 1201, and the second electrode 1203 that reflects visible light is provided over the EL layer 1202.

A method for fabricating the light-emitting panel of this example is described.

First, a base film, a separation layer (a tungsten film), and a layer to be separated were formed in this order over a glass substrate that was a formation substrate. In this example, the layer to be separated includes the insulating film 1224, the auxiliary wiring 1206, the first electrode 1201, and the partition wall 1205.

A total of seven auxiliary wirings 1206 were formed over the insulating film 1224. At this time, the auxiliary wirings 1206 with a width L2 of 322 µm were formed at a pitch of 5.3 mm. As the first electrode 1201, a film of indium tin oxide containing silicon oxide (ITSO) was formed. A total of seven partition walls 1205 covering the auxiliary wirings 1206 were formed to have a width L1 of 330 µm.

Then, a temporary support substrate and the first electrode 1201 were attached to each other with an adhesive for separation. Then, the layer to be separated was separated from the formation substrate along the separation layer. Thus, the separated layer was provided on the temporary support substrate side.

Next, the layer that was separated from the formation substrate and where the insulating film 1224 was exposed was attached to the support substrate 1229 using a UV curable adhesive. As the support substrate 1229, a diffusion film of a polyester-based resin was used as described above. Then, the temporary support substrate was separated, whereby the first electrode 1201 was exposed over the support substrate 1229.

Next, the EL layer 1202 and the second electrode 1203 were formed over the first electrode 1201. As the EL layer 1202, a first EL layer including a light-emitting layer containing a fluorescent compound emitting blue light, an intermediate layer, and a second EL layer including a light-emitting layer containing a phosphorescent compound emitting green light and a light-emitting layer containing a phosphorescent compound emitting red light were stacked in this order from the first electrode 1201 side. Silver was used for the second electrode 1203.

Then, a photo-curable resin containing zeolite that serves as the sealant 1227 was applied and cured by UV light irradiation. Next, the support substrate 1229 and the substrate including the thin glass layer and the polyethylene terephthalate (PET) layer that was the sealing substrate 1228 were attached to each other with a UV curable adhesive.

Figure 13:
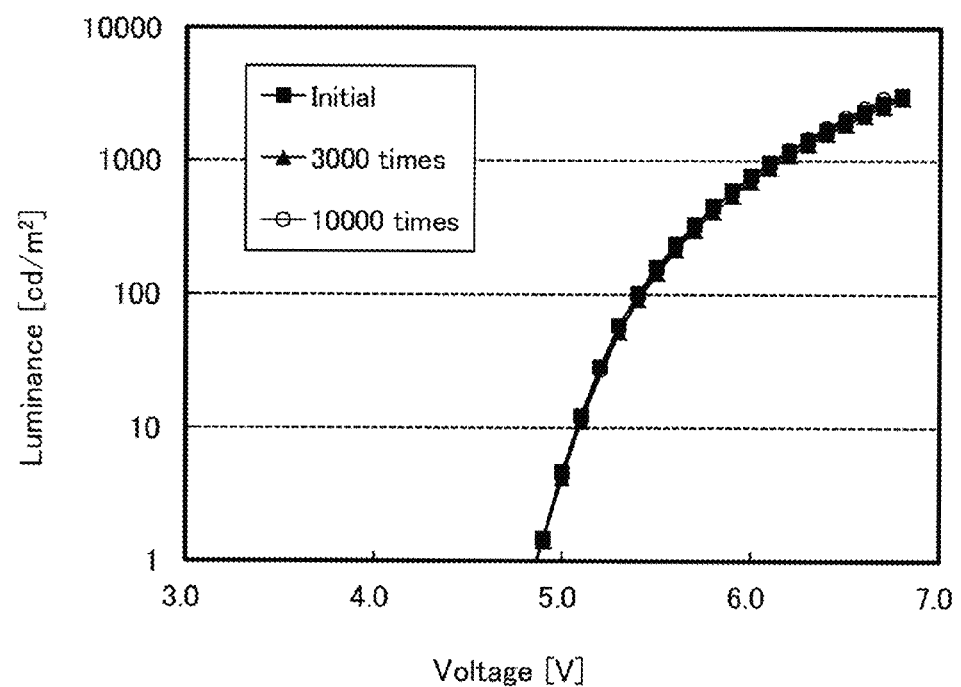
FIG. 13 shows voltage-luminance characteristics of a light-emitting panel of one example.
Figure 14:
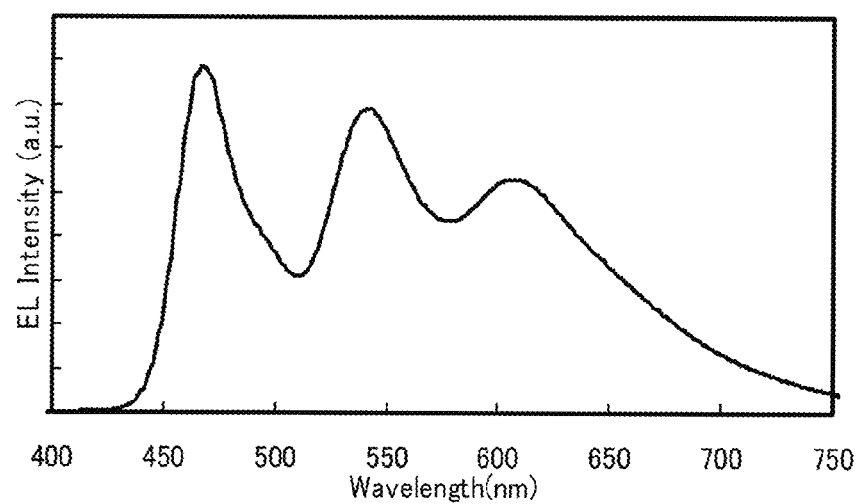
FIG. 14 shows an emission spectrum of a light-emitting panel of one example.

Operation characteristics of the light-emitting panel obtained in the above-described manner were measured. Voltage-luminance characteristics of the light-emitting panel are shown in FIG. 13 as indicated by "initial" in a legend. An emission spectrum of the light-emitting panel is shown in FIG. 14. It is found from FIG. 14 that the light-emitting panel of this example shows an emission spectrum including light originating from the fluorescent compound emitting blue light, light originating from the phosphorescent compound emitting green light, and light originating from the phosphorescent compound emitting red light.

After that, a light-emitting device including the light-emitting panel was subjected to a reliability test. In the reliability test, the light-emitting panel was made to emit light 3000 times or 10000 times with intervals. For each time of light emission, a current of 2 A was passed through the light-emitting panel for 50 milliseconds (ms). The current density of the light-emitting element at this time was 90 mA/cm$^2$. The interval between light emissions (i.e., non-light-emitting period) was 10 seconds.

FIG. 13 shows voltage-luminance characteristics of the light-emitting panel after 3000 times of light emission and those after 10000 times of light emission.

It can be seen from FIG. 13 that the voltage-luminance characteristics of the light-emitting panel even after 10000 times of light emission does not significantly differ from those before the reliability test and that the light-emitting panel does not deteriorate. This supports that the light-emitting panel of this example has high reliability.

Example 2

In this example, an organic EL element that can be used in one embodiment of the present invention is described.

In this measurement, the amount of current that can be fed to an organic EL element emitting white light was measured. The area of a light-emitting region in the organic EL element that was used was 2 mm×2 mm. For each time of light emission, current was fed to the organic EL element for 50 milliseconds (ms).

The examination showed that a current of 60 mA was able to be fed to the organic EL element (i.e., the current density was 1500 mA/cm$^2$). However, when a current of 68 mA was fed to the organic EL element (i.e., the current density was 1700 mA/cm$^2$), the organic EL element was short-circuited.

The above-described results indicate that in a light-emitting device of one embodiment of the present invention that includes the organic EL element, the amount of light can be adjusted when the current density is lower than 1700 mA/cm$^2$. Thus, a larger amount of current can be fed to the organic EL element than to a light-emitting diode or the like using an inorganic material.

Example 3

In this example, a light-emitting device of one embodiment of the present invention is described.

Figure 15:
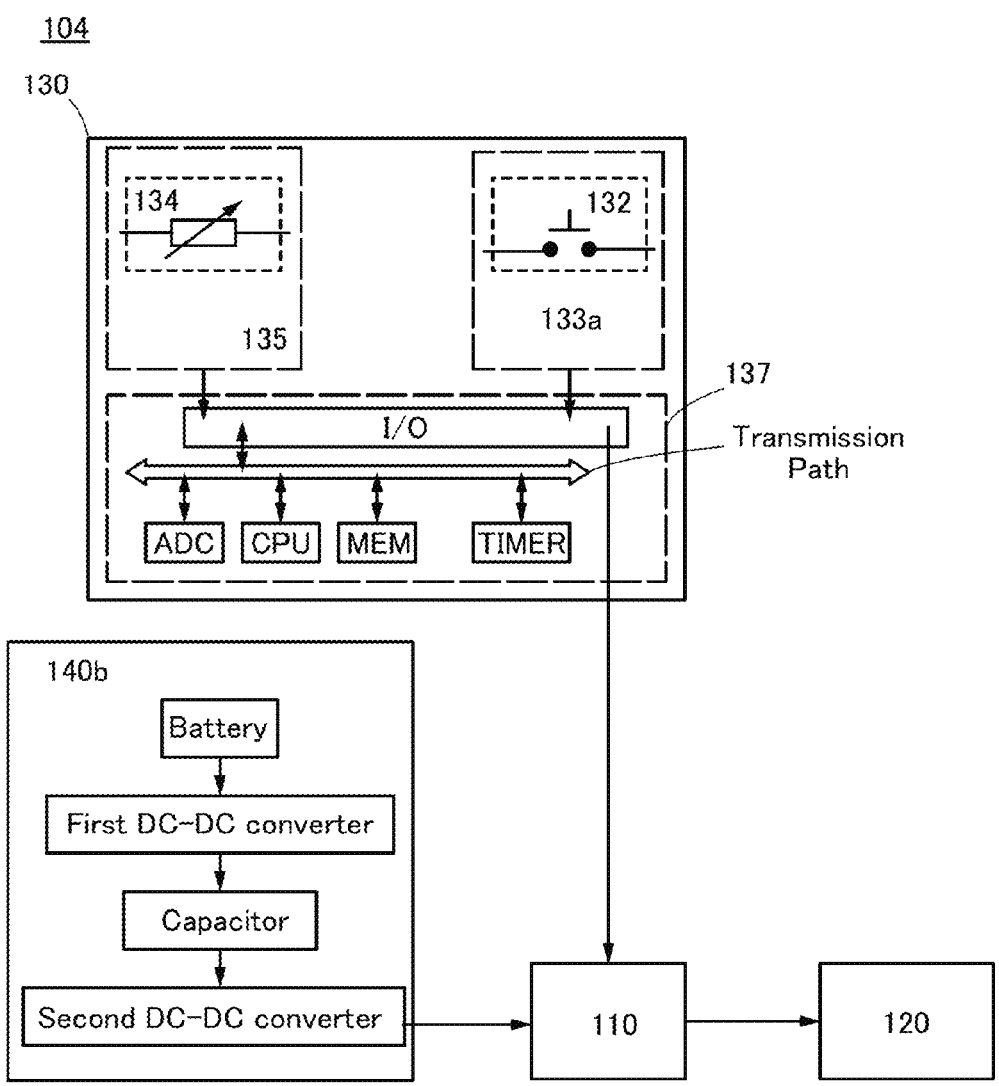
FIG. 15 illustrates a light-emitting device.

FIG. 15 is a block diagram illustrating a structure of a light-emitting device of one embodiment of the present invention.

A light-emitting device 104 described in this example includes the switching circuit 110, the light-emitting panel 120, the driver circuit 130, and the constant current power supply 140b. Note that the description in Embodiment 1 can be referred to for the components.

Specifically, the switching circuit 110 in this example intermittently supplies, to the light-emitting panel 120, a constant current pulse with a current of 2 A and a length of 50 milliseconds at intervals of 0.5 seconds to 5 seconds.

FIG. 6B is a plan view of a light-emitting panel fabricated in this example, FIG. 8A is a cross-sectional view taken along the dashed-dotted line X2-Y2 in FIG. 6B, and FIG. 8C is a cross-sectional view taken along the dashed-dotted line X3-Y3 in FIG. 6B. Note that some components of the light-emitting panel are omitted in FIG. 6B.

In the light-emitting panel of this example, the light-emitting element 1250 is formed over the support substrate 1220 with the insulating film 1224 therebetween. The auxiliary wiring 1206 is provided over the insulating film 1224 and is electrically connected to the first electrode 1201. The auxiliary wiring 1206 is partly exposed and functions as a terminal. An end portion of the first electrode 1201 and an end portion of the conductive layer 1210 are covered with the partition wall 1205. In addition, the partition wall 1205 is provided to cover the auxiliary wiring 1206 with the first electrode 1201 therebetween. The light-emitting element 1250 is sealed with the support substrate 1220, the sealing substrate 1228, and the sealant 1227.

In the light-emitting panel of this example, a light diffusion film of a polyester-based resin was used as the support substrate 1220, and a substrate including a thin glass layer and a polyethylene terephthalate (PET) layer was used as the sealing substrate 1228. These substrates are flexible, and the light-emitting panel of this example is a flexible light-emitting panel. Note that it can be said that the support substrate 1220 of this example has an outcoupling structure because the light diffusion film is used as the support substrate 1220.

A light-emitting region in the light-emitting panel of this example is obtained by excluding a circular non-light-emitting region with a diameter of 20 mm from an area of 50 mm×52.9 mm. The non-light-emitting region includes an opening of the light-emitting panel. The non-light-emitting region does not include the auxiliary wiring 1206 and the first electrode 1201 (see FIG. 8A). This structure can prevent the first electrode 1201 of the light-emitting element 1250 or the auxiliary wiring 1206 from being in contact with the second electrode 1203 and being short-circuited when an opening is formed.

The light-emitting element 1250 is an organic EL element having a bottom-emission structure; specifically, the first electrode 1201 transmitting visible light is provided over the support substrate 1220, an EL layer 1202 is provided over the first electrode 1201, and a second electrode 1203 reflecting visible light is provided over the EL layer 1202.

A method for fabricating the light-emitting panel of this example is described.

First, a base film, a separation layer (a tungsten film), and a layer to be separated were formed in this order over a glass substrate that was a formation substrate. In this example, the layer to be separated includes the insulating film 1224, the auxiliary wiring 1206, the first electrode 1201, and the partition wall 1205.

A total of 125 auxiliary wirings 1206 were formed over the insulating film 1224. At this time, the auxiliary wirings 1206 with a width L2 of 3 μm were formed at a pitch of 420 μm. As the first electrode 1201, a film of indium tin oxide containing silicon oxide (ITSO) was formed. A total of 125 partition walls 1205 covering the auxiliary wirings 1206 were formed to have a width L1 of 6 μm. The auxiliary wirings in the light-emitting panel of this example have a width as narrow as 3 μm, and thus are less likely to be recognized when the light-emitting panel emits light.

Then, a temporary support substrate and the first electrode 1201 were attached to each other with an adhesive for separation. Then, the layer to be separated was separated from the formation substrate along the separation layer. Thus, the layer to be separated is provided on the temporary support substrate side.

Next, the layer that was separated from the formation substrate and where the insulating film 1224 was exposed was attached to the support substrate 1220 with a UV curable adhesive. As the support substrate 1220, a diffusion film of a polyester-based resin was used as described above. Then, the temporary support substrate was separated, whereby the first electrode 1201 was exposed over the support substrate 1229.

Next, the EL layer 1202 and the second electrode 1203 were formed over the first electrode 1201. As the EL layer 1202, a first EL layer including a light-emitting layer containing a fluorescent compound emitting blue light, an intermediate layer, and a second EL layer including a light-emitting layer containing a phosphorescent compound emitting green light and a light-emitting layer containing a phosphorescent compound emitting orange light were stacked in this order from the first electrode 1201 side. Silver was used for the second electrode 1203.

Then, a UV curable resin containing zeolite that served as the sealant 1227 was applied and cured by UV light irradiation. Next, the support substrate 1220 and the substrate including the thin glass layer and the polyethylene terephthalate (PET) layer that was the sealing substrate 1228 were attached to each other with a UV curable adhesive.

Then, a circular opening was formed to overlap a non-light-emitting region surrounded by the light-emitting region. In this example, the opening is formed in part of the light-emitting panel with laser light having a wavelength in the UV region (i.e., UV laser light). The opening can be formed with a punch or the like instead of laser light, in which case peeling of a film, especially the EL layer 1202 or the like, might occur because of pressure applied to the light-emitting panel. Laser light is preferably used to form the opening, in which case peeling of a film can be prevented and a highly reliable light-emitting panel can be fabricated.

Then, an end portion of the light-emitting panel that was exposed in the opening was covered with a UV curable adhesive, and the sealant 1226 was provided.

Figure 16:
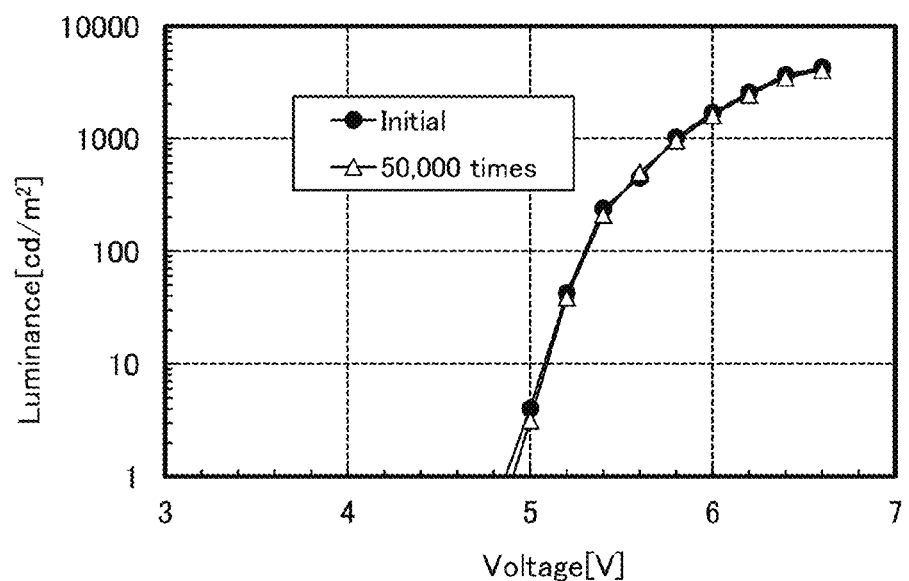
FIG. 16 shows voltage-luminance characteristics of a light-emitting panel of one example.
Figure 17:
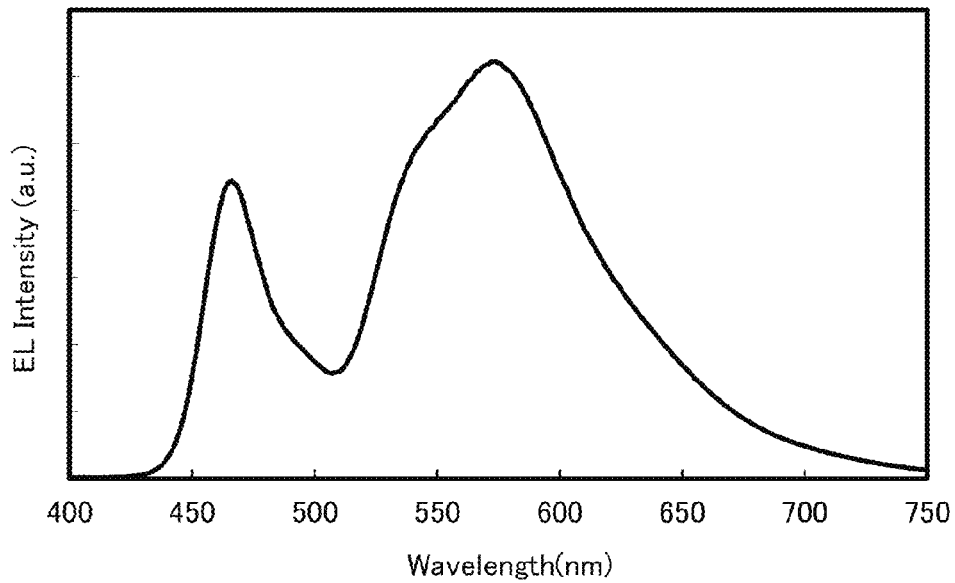
FIG. 17 shows an emission spectrum of a light-emitting panel of one example.

Operation characteristics of the light-emitting panel obtained in the above-described manner were measured. Voltage-luminance characteristics of the light-emitting panel are shown in FIG. 16 as indicated by "initial" in a legend. An emission spectrum of the light-emitting panel is shown in FIG. 17. It is found from FIG. 17 that the light-emitting panel of this example shows an emission spectrum including light originating from the fluorescent compound emitting blue light, light originating from the phosphorescent compound emitting green light, and light originating from the phosphorescent compound emitting orange light.

Note that the light-emitting panel 120 emits light at a luminance of approximately 100000 cd/m$^2$ when supplied with a current of 2 A.

After that, a light-emitting device including the light-emitting panel was subjected to a reliability test. In the reliability test, the light-emitting panel was made to emit light 50000 times with intervals. For each time of light emission, a current of 2 A was fed to the light-emitting panel for 50 milliseconds (ms). The current density of the light-emitting element at this time was 87 mA/cm$^2$. The interval between light emissions (non-light-emitting period) was 0.5 seconds (s).

FIG. 16 shows voltage-luminance characteristics of the light-emitting panel after 50000 times of light emission.

It can be seen from FIG. 16 that the voltage-luminance characteristics of the light-emitting panel even after 50000 times of light emission does not significantly differ from those before the reliability test and that the light-emitting panel does not deteriorate. It is indicated that even when the light-emitting panel 120 is made to blink for 50 milliseconds 50000 times at intervals of 0.5 seconds, heat generation due to light emission has little influence on the light-emitting panel 120 because the actual lighting time of the light-emitting panel 120 is only approximately 40 minutes.

The light-emitting device 104 described in this example includes the light-emitting panel 120 in which an organic EL element is used. This structure can expand the light-emitting region in a plane. Thus, a small light-emitting device can be provided.

The light-emitting panel 120 can be lighter, thinner, and larger than another light-emitting panel using another light-emitting element (e.g., LED). Thus, the proportion of the light-emitting panel in sight can be increased easily.

When a person directly looks at a light-emitting panel that intermittently emits light at a luminance of approximately 100000 cd/m$^2$, the person is dazzled by the light.

The light-emitting device 104 can be used for, for example, a security device. Specifically, with the light-emitting device 104, a person intermittently emits light toward an assailant when attacked. This can make the assailant flinch and hesitate to attack.

In addition, when the light-emitting device 104 is provided in a portable camera or a mobile phone with a camera, the light-emitting device 104 can function as both a flash and a security device. Note that the amount of current supplied by the constant current power supply 140b may be changed depending on the purpose or the ambient brightness. Specifically, the luminance of the light-emitting device 104 that is used as a security device may be higher than the luminance of the light-emitting device 104 that is used as a camera flash.

In addition, when the light-emitting device 104 is used as a warning light of, for example, a bicycle, the position of the bicycle can be recognized by other vehicles, passersby, or the like. This can prevent accidents.

This application is based on Japanese Patent Application serial no. 2013-170613 filed with the Japan Patent Office on Aug. 20, 2013, the entire contents of which are hereby incorporated by reference.

What is claimed is:

1. A light-emitting device comprising:
   a driver circuit configured to supply a control pulse signal;
   a constant current power supply configured to be supplied with the control pulse signal and supply a constant current pulse; and
   a light-emitting panel configured to be supplied with the constant current pulse,
   wherein the driver circuit comprises:
      a start switch circuit configured to supply a start signal;
      a pulse-interval modulation circuit configured to supply a pulse-interval modulation signal; and
      a microcomputer configured to be supplied with the start signal and the pulse-interval modulation signal and supply the control pulse signal.

2. The light-emitting device according to claim 1, further comprising a control device configured to supply a control signal,
   wherein the constant current power supply is configured to be supplied with the control signal, and
   wherein the control signal controls the magnitude of the constant current pulse.

3. The light-emitting device according to claim 1,
   wherein the driver circuit supplies the control pulse signal so that the constant current power supply supplies the constant current pulse with a half width of 1 millisecond or more and 1000 milliseconds or less.

4. The light-emitting device according to claim 1, further comprising:
   an optical sensor configured to supply a first detection signal corresponding to a detected amount of light; and
   a control device comprising an arithmetic unit and configured to be supplied with the first detection signal,
   wherein the arithmetic unit is configured to perform an arithmetic operation using the first detection signal, and
   wherein the control device is configured to supply a control signal so that the constant current power supply supplies a constant current corresponding to a result of the arithmetic operation.

5. The light-emitting device according to claim 1, further comprising:
   a distance sensor configured to supply a second detection signal corresponding to a detected distance; and
   a control device comprising an arithmetic unit and configured to be supplied with the second detection signal, wherein the arithmetic unit is configured to perform an arithmetic operation using the second detection signal, and wherein the control device is configured to supply a control signal so that the constant current power supply supplies a constant current corresponding to a result of the arithmetic operation.

6. The light-emitting device according to claim 1, further comprising:
an optical sensor configured to supply a first detection signal corresponding to a detected amount of light;
a distance censor configured to supply a second detection signal corresponding to a detected distance; and
a control device comprising an arithmetic unit and configured to be supplied with the first detection signal and the second detection signal,
wherein the arithmetic unit is configured to perform an arithmetic operation using the first detection signal and the second detection signal, and
wherein the control device is configured to supply a control signal so that the constant current power supply supplies a constant current corresponding to a result of the arithmetic operation.

7. The light-emitting device according to claim 1, wherein the light-emitting panel comprises:
a support substrate; and
a light-emitting element over the support substrate, and
wherein the light-emitting element comprises:
a first electrode on the support substrate side;
a second electrode overlapping the first electrode; and
an EL layer between the first electrode and the second electrode.

8. The light-emitting device according to claim 7, wherein the support substrate is flexible, and
wherein the light-emitting panel has a curved surface.

9. The light-emitting device according to claim 1, wherein the constant current power supply comprises:
an AC-DC converter configured to supply a direct current; and
a DC-DC converter configured to be supplied with the direct current and supply the constant current pulse.

10. A camera comprising the light-emitting device according to claim 1.

11. A light-emitting device comprising:
a driver circuit configured to supply a control pulse signal;
a constant current power supply configured to supply a constant current;
a switching circuit configured to be supplied with the constant current and the control pulse signal and supply a constant current pulse; and
a light-emitting panel configured to be supplied with the constant current pulse,
wherein the driver circuit comprises:
a start switch circuit configured to supply a start signal;
a pulse-interval modulation circuit configured to supply a pulse-interval modulation signal, and
a microcomputer configured to be supplied with the start signal and the pulse-interval modulation signal and supply the control pulse signal.

12. The light-emitting device according to claim 11, further comprising a control device configured to supply a control signal,
wherein the constant current power supply is configured to be supplied with the control signal, and
wherein the control signal controls the magnitude of the constant current pulse.

13. The light-emitting device according to claim 11, wherein the driver circuit supplies the control pulse signal so that the switching circuit supplies the constant current pulse with a half width of 1 millisecond or more and 1000 milliseconds or less.

14. The light-emitting device according to claim 11, further comprising:
an optical sensor configured to supply a first detection signal corresponding to a detected amount of light; and
a control device comprising an arithmetic unit and configured to be supplied with the first detection signal,
wherein the arithmetic unit is configured to perform an arithmetic operation using the first detection signal, and
wherein the control device is configured to supply a control signal so that the constant current power supply supplies the constant current corresponding to a result of the arithmetic operation.

15. The light-emitting device according to claim 11, further comprising:
a distance sensor configured to supply a second detection signal corresponding to a detected distance; and
a control device comprising an arithmetic unit and configured to be supplied with the second detection signal,
wherein the arithmetic unit is configured to perform an arithmetic operation using the second detection signal, and
wherein the control device is configured to supply a control signal so that the constant current power supply supplies the constant current corresponding to a result of the arithmetic operation.

16. The light-emitting device according to claim 11, further comprising:
an optical sensor configured to supply a first detection signal corresponding to a detected amount of light;
a distance censor configured to supply a second detection signal corresponding to a detected distance; and
a control device comprising an arithmetic unit and configured to be supplied with the first detection signal and the second detection signal,
wherein the arithmetic unit is configured to perform an arithmetic operation using the first detection signal and the second detection signal, and
wherein the control device is configured to supply a control signal so that the constant current power supply supplies the constant current corresponding to a result of the arithmetic operation.

17. The light-emitting device according to claim 11, wherein the light-emitting panel comprises:
a support substrate; and
a light-emitting element over the support substrate, and
wherein the light-emitting element comprises:
a first electrode on the support substrate side;
a second electrode overlapping the first electrode; and
an EL layer between the first electrode and the second electrode.

18. The light-emitting device according to claim 17, wherein the support substrate is flexible, and
wherein the light-emitting panel has a curved surface.

19. The light-emitting device according to claim 11, wherein the constant current power supply comprises:
an AC-DC converter configured to supply a direct current; and
a DC-DC converter configured to be supplied with the direct current and supply the constant current pulse.

20. The light-emitting device according to any one of claim 11,
   wherein the constant current power supply comprises:
   a battery configured to supply a first voltage;
   a first DC-DC converter configured to be supplied with the first voltage and supply a second voltage higher than the first voltage;
   a capacitor configured to be supplied with the second voltage; and
   a second DC-DC converter configured to be supplied with a charge from the capacitor and supplies the constant current.

21. A camera comprising the light-emitting device according to claim 11.

* * * * *